(12) United States Patent
Zabroda et al.

(10) Patent No.: US 11,811,419 B2
(45) Date of Patent: *Nov. 7, 2023

(54) METHOD AND SYSTEM FOR AN ASYNCHRONOUS SUCCESSIVE APPROXIMATION REGISTER ANALOG-TO-DIGITAL CONVERTER WITH WORD COMPLETION ALGORITHM

(71) Applicant: Cisco Technology, Inc., San Jose, CA (US)

(72) Inventors: Oleksiy Zabroda, Constable, NY (US); Vidyadhar Vuppula, Irvine, CA (US)

(73) Assignee: Cisco Technology, Inc., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/652,213

(22) Filed: Feb. 23, 2022

(65) Prior Publication Data

US 2022/0182069 A1    Jun. 9, 2022

Related U.S. Application Data

(63) Continuation-in-part of application No. 16/983,888, filed on Aug. 3, 2020, now Pat. No. 11,290,122, which is a continuation of application No. 16/457,121, filed on Jun. 28, 2019, now Pat. No. 10,749,542.

(60) Provisional application No. 62/692,311, filed on Jun. 29, 2018.

(51) Int. Cl.
*H03M 1/46*     (2006.01)
*H03M 1/12*     (2006.01)
*H03M 1/42*     (2006.01)

(52) U.S. Cl.
CPC .......... *H03M 1/466* (2013.01); *H03M 1/125* (2013.01); *H03M 1/42* (2013.01); *H03M 1/462* (2013.01)

(58) Field of Classification Search
CPC ........ H03M 1/466; H03M 1/125; H03M 1/42; H03M 1/462
See application file for complete search history.

(56) References Cited

U.S. PATENT DOCUMENTS

| | | | |
|---|---|---|---|
| 8,482,449 B1 * | 7/2013 | Zabroda | H03M 1/0863 341/172 |
| 8,872,691 B1 * | 10/2014 | Stepanovic | H03M 1/06 341/158 |
| 8,957,802 B1 | 2/2015 | Evans | |
| 9,484,945 B1 | 11/2016 | Wan et al. | |
| 9,571,115 B1 | 2/2017 | Beukema et al. | |

(Continued)

*Primary Examiner* — Lam T Mai
(74) *Attorney, Agent, or Firm* — Patterson + Sheridan, LLP

(57) ABSTRACT

Systems and methods for an asynchronous successive approximation register analog-to-digital converter (SAR ADC) with word completion algorithm may include a SAR ADC comprising a plurality of switched capacitors, a comparator, a metastability detector including a timer having a tunable time interval, and a successive approximation register. The SAR ADC may sample input signals at inputs of the switched capacitors and compare signals at outputs of the switched capacitors. The SAR ADC may also determine, based on a value of a tunable time interval, whether to set a metastability flag for a first bit to be evaluated and update the value of the tunable time interval based on whether the metastability flag was set.

20 Claims, 18 Drawing Sheets

(56) References Cited

U.S. PATENT DOCUMENTS

| | | | |
|---|---|---|---|
| 9,621,179 B1 | 4/2017 | Maulik et al. | |
| 10,044,364 B1 | 8/2018 | Sharif | |
| 10,749,542 B2 | 8/2020 | Zabroda | |
| 10,840,934 B2* | 11/2020 | Benjaram | H03M 1/1042 |
| 10,965,300 B1* | 3/2021 | Weng | H03M 1/0612 |
| 10,972,120 B1* | 4/2021 | Abu Hilal | H03M 1/68 |
| 11,146,282 B1* | 10/2021 | Lok | H03M 1/462 |
| 11,290,122 B2 | 3/2022 | Zabroda | |
| 2015/0280727 A1 | 10/2015 | Lien | |
| 2017/0111055 A1 | 4/2017 | El-Chammas | |
| 2020/0007144 A1* | 1/2020 | Zabroda | H03M 1/42 |
| 2020/0220553 A1* | 7/2020 | Zabroda | H03M 1/462 |
| 2020/0366309 A1* | 11/2020 | Zabroda | H03M 1/462 |
| 2022/0407532 A1* | 12/2022 | Yonar | H03M 1/462 |

* cited by examiner

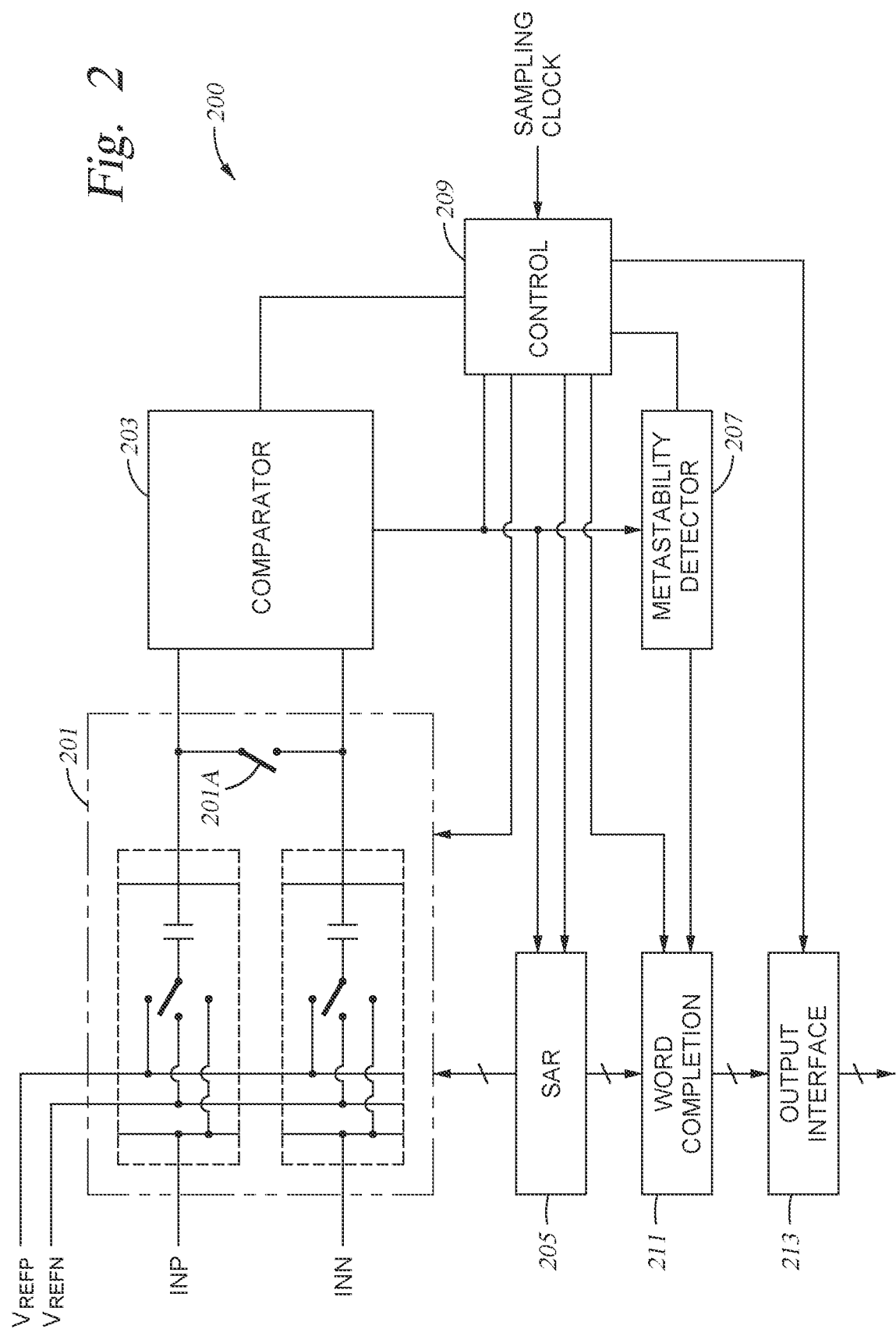

METHOD AND SYSTEM FOR AN ASYNCHRONOUS SUCCESSIVE APPROXIMATION REGISTER ANALOG-TO-DIGITAL CONVERTER WITH WORD COMPLETION ALGORITHM

CROSS-REFERENCE TO RELATED APPLICATIONS

This application is a continuation-in-part of continuation U.S. patent application Ser. No. 16/983,888, filed Aug. 3, 2020, which is a continuation of U.S. patent application Ser. No. 16/457,121 filed Jun. 28, 2019, which issued on Aug. 18, 2020 as U.S. Pat. No. 10,749,542 and claims benefit of U.S. Provisional Application No. 62/692,311 filed Jun. 29, 2018. The aforementioned related patent applications are herein incorporated by reference in their entirety.

FIELD

Aspects of the present disclosure relate to electronic components. More specifically, certain embodiments of the disclosure relate to a method and system for an asynchronous successive approximation register analog-to-digital converter with word completion algorithm.

BACKGROUND

Conventional approaches for performing analog-to-digital conversions may be costly, cumbersome, and/or inefficient—e.g., they may be complex and/or time consuming, require considerable power, and/or may introduce errors or distortion.

Further limitations and disadvantages of conventional and traditional approaches will become apparent to one of skill in the art, through comparison of such systems with some aspects of the present disclosure as set forth in the remainder of the present application with reference to the drawings.

BRIEF SUMMARY

A system and/or method for an asynchronous successive approximation register analog-to-digital converter with word completion algorithm, substantially as shown in and/or described in connection with at least one of the figures, as set forth more completely in the claims.

These and other advantages, aspects and novel features of the present disclosure, as well as details of an illustrated embodiment thereof, will be more fully understood from the following description and drawings.

BRIEF DESCRIPTION OF SEVERAL VIEWS OF THE DRAWINGS

FIG. 2 is a block diagram illustrating a SAR ADC, in accordance with an embodiment of the disclosure.

DETAILED DESCRIPTION

Figure 1A:
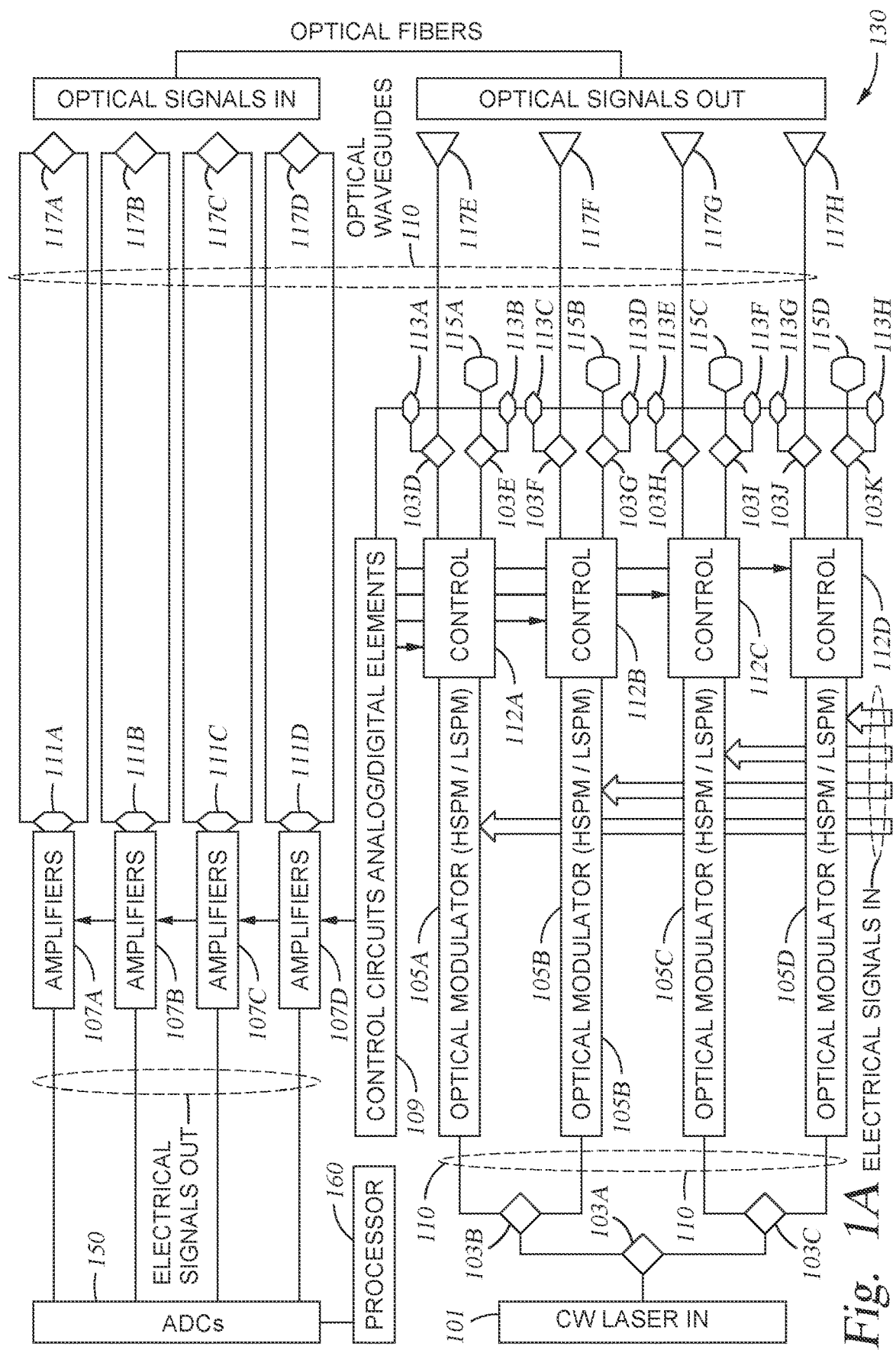
FIG. 1A is a block diagram of a photonically-enabled integrated circuit with an asynchronous successive approximation register (SAR) analog-to-digital converter with word completion algorithm, in accordance with an example embodiment of the disclosure.

FIG. 1A is a block diagram of a photonically-enabled integrated circuit with an asynchronous successive approximation register (SAR) analog-to-digital converter with word completion algorithm, in accordance with an example embodiment of the disclosure. Referring to FIG. 1A, there are shown optoelectronic devices in a photonically-enabled integrated circuit 130 comprising optical modulators 105A-105D, photodiodes 111A-111D, monitor photodiodes 113A-113D, and optical devices comprising couplers 103A-103C and grating couplers 117A-117H. There are also shown electrical devices and circuits comprising amplifiers 107A-107D, analog and digital control circuits 109, control sections 112A-112D, analog-to-digital converters (ADCs) 150, and a processor 160. The amplifiers 107A-107D may comprise transimpedance and limiting amplifiers (TIA/LAs), for example.

In an example scenario, the photonically-enabled integrated circuit 130 comprises a CMOS photonics die with a laser assembly 101 coupled to the top surface of the IC 130. The laser assembly 101 may comprise one or more semiconductor lasers with isolators, lenses, and/or rotators for directing one or more continuous-wave (CW) optical signals to the coupler 103A. The photonically enabled integrated circuit 130 may comprise a single chip, or may be integrated on a plurality of die, such as with one or more electronics die and one or more photonics die.

Optical signals are communicated between optical and optoelectronic devices via optical waveguides 110 fabricated in the photonically-enabled integrated circuit 130. Single-mode or multi-mode waveguides may be used in photonic integrated circuits. Single-mode operation enables direct connection to optical signal processing and networking elements. The term "single-mode" may be used for waveguides that support a single mode for each of the two polarizations, transverse-electric (TE) and transverse-magnetic (TM), or for waveguides that are truly single mode and only support one mode.

In an example scenario, the couplers 103A-103C may comprise low-loss Y-junction power splitters where coupler 103A receives an optical signal from the laser assembly 101 and splits the signal to two branches that direct the optical signals to the couplers 103B and 103C, which split the optical signal once more, resulting in four roughly equal power optical signals.

The optical power splitter, may comprise at least one input waveguide and at least two output waveguides. The couplers 103A-103C shown in FIG. 1A illustrate 1-by-2 splitters, which divide the optical power in one waveguide into two other waveguides evenly. These Y-junction splitters may be used in multiple locations in an optoelectronic system, such as in a Mach-Zehnder interferometer (MZI) modulator, e.g., the optical modulators 105A-105D, where a splitter and a combiner are needed, since a power combiner can be a splitter used in reverse.

The optical modulators 105A-105D comprise Mach-Zehnder or ring modulators, for example, and enable the modulation of the continuous-wave (CW) laser input signal. The optical modulators 105A-105D may comprise high-speed and low-speed phase modulation sections and are controlled by the control sections 112A-112D. The high-speed phase modulation section of the optical modulators 105A-105D may modulate a CW light source signal with a data signal. The low-speed phase modulation section of the optical modulators 105A-105D may compensate for slowly varying phase factors such as those induced by mismatch between the waveguides, waveguide temperature, or waveguide stress and is referred to as the passive phase, or the passive biasing of the MZI.

One output of each of the optical modulators 105A-105D may be optically coupled via the waveguides 110 to the grating couplers 117E-117H. The other outputs of the optical modulators 105A-105D may be optically coupled to monitor photodiodes 113A-113D to provide a feedback path. The IC 130 may utilize waveguide based optical modulation and receiving functions. Accordingly, the receiver may employ an integrated waveguide photo-detector (PD), which may be implemented with epitaxial germanium/SiGe films deposited directly on silicon, for example.

The grating couplers 117A-117H may comprise optical gratings that enable coupling of light into and out of the photonically-enabled integrated circuit 130. The grating couplers 117A-117D may be utilized to couple light received from optical fibers into the photonically-enabled integrated circuit 130, and the grating couplers 117E-117H may be utilized to couple light from the photonically-enabled integrated circuit 130 into optical fibers. The grating couplers 117A-117H may comprise single polarization grating couplers (SPGC) and/or polarization splitting grating couplers (PSGC). In instances where a PSGC is utilized, two input, or output, waveguides may be utilized.

Optical fibers may be epoxied, for example, to the CMOS chip, and may be aligned at an angle from normal to the surface of the photonically-enabled integrated circuit 130 to optimize coupling efficiency. In an example embodiment, the optical fibers may comprise single-mode fiber (SMF) and/or polarization-maintaining fiber (PMF).

In another exemplary embodiment, optical signals may be communicated directly into the surface of the photonically-enabled integrated circuit 130 without optical fibers by directing a light source on an optical coupling device in the chip, such as the couplers 117A-117D. This may be accomplished with directed laser sources and/or optical sources on another chip flip-chip bonded to one or more chips comprising the photonically-enabled integrated circuit 130.

The photodiodes 111A-111D may convert optical signals received from the grating couplers 117A-117D into electrical signals that are communicated to the amplifiers 107A-107D for processing. In another embodiment of the disclosure, the photodiodes 111A-111D may comprise high-speed heterojunction phototransistors, for example, and may comprise germanium (Ge) in the collector and base regions for absorption in the 1.3-1.6 μm optical wavelength range, and may be integrated on a CMOS silicon-on-insulator (SOI) wafer.

The analog and digital control circuits 109 may control gain levels or other parameters in the operation of the amplifiers 107A-107D, which may then communicate electrical signals to the ADCs 150 for subsequent processing by the processor 160. The control sections 112A-112D comprise electronic circuitry that enables modulation of the CW laser signal received from the splitters 103A-103C. The optical modulators 105A-105D may require high-speed electrical signals to modulate the refractive index in respective branches of a Mach-Zehnder interferometer (MZI), for example.

The ADCs 150 may comprise a plurality of ADCs for converting received analog signals from the amplifiers 107A-107D to digital signals for processing by the processor 160. In an example scenario, the ADCs 150 comprise successive approximation register (SAR) ADCs, as described further with respect to FIGS. 1B-9. While the ADCs 150 are described in the photonically-enabled integrated circuit 130, this is merely an example, as other applications are possible where analog signals are desired to be converted to digital signals.

In operation, the photonically-enabled integrated circuit 130 may be operable to transmit and/or receive and process optical signals. Optical signals may be received from optical fibers by the grating couplers 117A-117D and converted to electrical signals by the photodetectors 111A-111D. The electrical signals may be amplified by transimpedance amplifiers in the amplifiers 107A-107D, for example, and subsequently communicated to the ADCs 150 for conversion to digital signals for further processing by the processor 160.

While FIG. 1A illustrates an optical transceiver application, the disclosure is not so limited. Accordingly, the SAR ADC with word completion algorithm may be utilized in any application where it is desired to convert an analog signal to a digital signal.

Figure 1B:
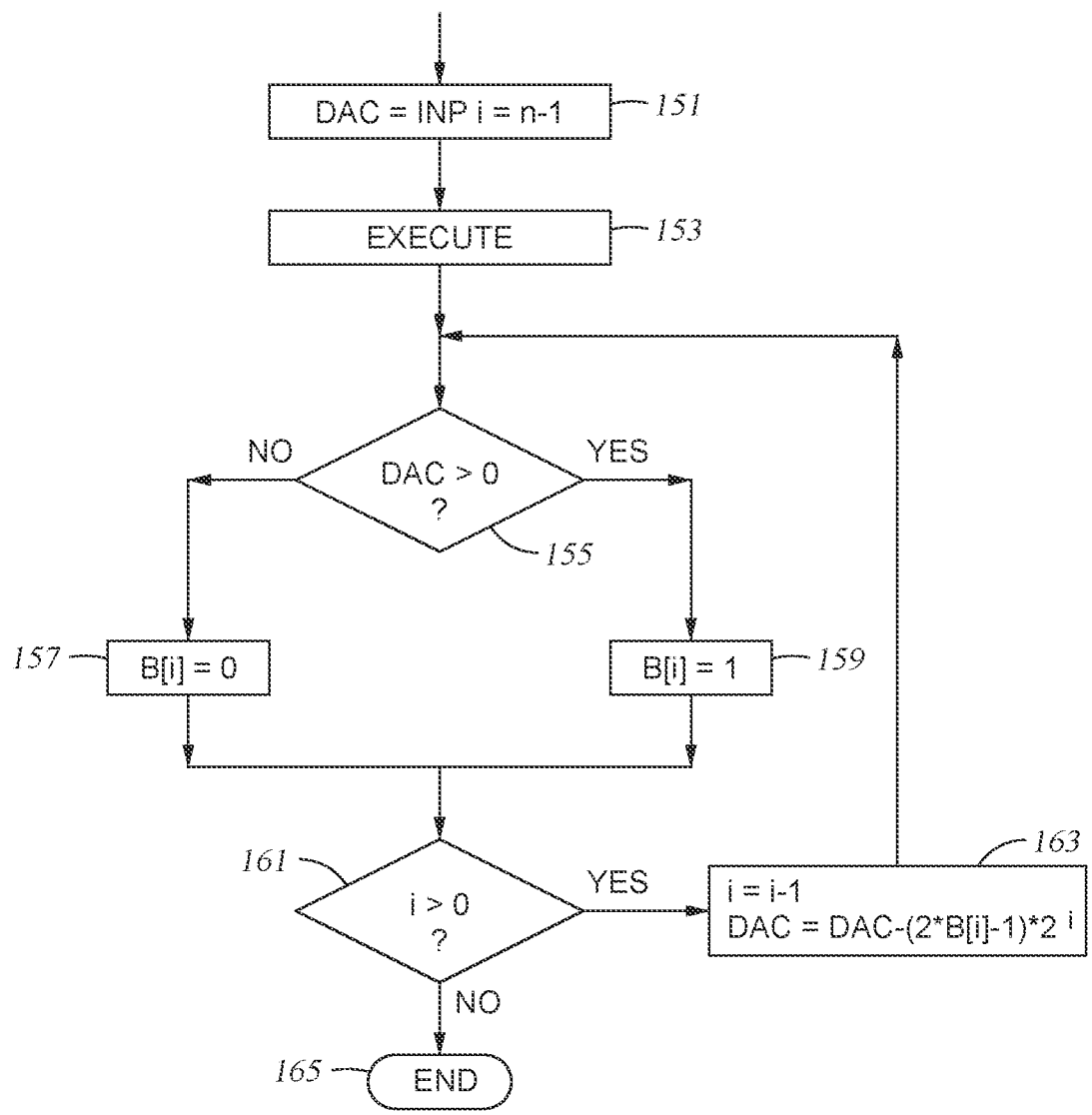
FIG. 1B illustrates a process flowchart for a SAR ADC, in accordance with an example embodiment of the disclosure.

FIG. 1B illustrates a process flowchart for a SAR ADC, in accordance with an example embodiment of the disclosure. The SAR ADC architecture is an effective high speed time interleaved ADC, primarily due to a high achievable figure of merit compared to the other architectures. SAR ADCs execute a consecutive bit-by-bit search method starting from the most significant bit (MSB) and bit-by-bit moves down to the least significant bit (LSB).

An example of such a method for an ADC with n bits resolution is depicted in FIG. 1B. For the sake of simplicity, the dynamic range of the differential input signal is set to $+/-(2^n-1)/2$, where n is the number of bits to be evaluated, and offset binary coding scheme is used for the converted digital output. In this scheme the lower limit of the input dynamic range is represented by 0 and the upper limit is represented by $2^n-1$ (the digital word contains all ones).

Referring to FIG. 1B, the process starts with step 151 where the SAR ADC samples the input signal and sets the counter i to n-1, where n is the number of bits, followed by step 153 where the bit evaluation begins. In step 155, if the DAC output is greater than zero, the process moves to step 159 where B[i] is set to one before proceeding to step 161. If the DAC output is not greater than zero in step 155, the process moves to step 157 where B[i] is set to zero before proceeding to step 161. In step 161, if i is greater than zero, the process moves to step 163 where $2^i(2*B(i)-1)$ is subtracted from DAC value and then the counter i is decremented by one before moving back to step 155 for further DAC measurement. If i=0, meaning the LSB was evaluated, the process ends at step 165. The result of the method execution is the values of all n bits B[(n-1):0].

Synchronous SAR ADC operation is controlled by an external clock with a fixed clock time interval. In this architecture, the same time is allocated for evaluation of any bit. In contrast, in an asynchronous SAR ADC, the external clock is used only to initiate a symbol conversion procedure. The signals controlling the conversion of all the bits are then generated internally. The conversion of a lower significant bit may start after the conversion of the previous (more significant bit) is finalized. The evaluation of any bit can take as much time as it is needed for the comparator latch to exit the regeneration mode.

If the input voltages of the comparator of an asynchronous SAR ADC are too close to each other, the comparator latch can stay abnormally long in a regeneration mode (metastability condition) leaving not enough time for evaluation of less significant bits. On the other hand, if this condition occurs, the rest of the bits may simply be complementary to the bit of the metastability.

To tag a bit with metastability, the duration of the comparator clock pulses may be compared with a special timing interval generated by a metastability timer. If the evaluation of any bit takes more time than the special timing interval, the timer may produce a pulse, which is used to mark this specific bit. At the end of the symbol conversion cycle, if the LSB is not evaluated, the word completion algorithm finds the bit marked with the metastability flag and assigns the opposite, complementary, value to the rest of the lower significance bits. If the bit marked with the metastability flag is not completely finalized, it can be assigned with any value as long as the rest of the bits are assigned with the opposite value.

Due to process and temperature variation as well as component mismatch on semiconductor die, it is difficult to match the duration of this special metastability time interval with the time needed for the latch to get out of the metastability condition.

In an example scenario, the duration of the pulse generated by the timer may be background calibrated during normal operation of the SAR ADC. The timer duration may be controlled by a register, which is updated at the end of each symbol conversion as follows: 1) If both Bit<0> and (Any Other Bit) are tagged during one conversion cycle, one bit is added to the register content; thus increasing the timer pulse duration; 2) If no bit is tagged at all, one bit is subtracted from the register content, thus reducing the timer pulse duration; and 3) If only one bit gets tagged during the conversion cycle, the counter content remains unchanged.

FIG. 2 is a block diagram illustrating a successive approximation register analog-to-digital converter, in accordance with an embodiment of the disclosure. Referring to FIG. 2, there is shown an ADC 200 comprising a switched capacitor DAC 201, a comparator 203, a successive approximation register (SAR) 205, a metastability detector 207, control block 209, a word completion block 211, and output interface 213.

The switched capacitor DAC 201 may comprise a plurality of switches coupled to one or more capacitors for storing a charge from sampled input signals at each input $In_n$ and $In_p$. In an example scenario, the switched capacitor DAC 201 comprises a pair of identical arrays of switched capacitor cells interconnected in binary weighted bit groups and a switch 201A for shorting the differential inputs of the comparator to each other and to the comparator input bias voltage source. The switch 201A may receive an input control signal from the control block 209, for example.

The switched capacitor DAC 201 may have multiple inputs, including $In_n$ and $In_p$, and an input from the SAR 205 and control block 209, and also comprises two outputs coupled to the comparator 203. The input from the control block 209 may enable the configuration of tracking and sampling of the input signal applied to inputs $In_n$ and In in the switched capacitor DAC 201, and thus the overall operation of the ADC 200. Furthermore, the switched capacitor DAC 201 comprises reference voltage inputs, Vrefn and Vrefp. The inputs from the SAR 205 may couple the switched capacitor cells to Vrefn or Vrefp and thus performing successive bit by bit approximation of the sampled input signal.

The comparator 203 may comprise circuitry, logic, and/or code for comparing the signals at its inputs, for configuring the output of the comparator 203, depending on whether it is greater than or less than a reference level. In a single ended ADC configuration, one input signal of the comparator 203 may comprise a reference level and the other input signal coming from a single ended capacitor DAC 201. When activated, the comparator 203 may generate one output signal or two complementary outputs that are coupled to the control block 209 and to the metastability detector 207.

The SAR 205 may comprise circuitry, logic, and/or code for receiving data from the comparator 203 and the control block 209 and for providing a feedback signal to the switched capacitor DAC 201, the feedback signal for configuring the switched capacitor DAC 201, for example.

At the beginning of each symbol conversion, the switched capacitor DAC 201 samples the input signal. Then, starting with the most significant bit (MSB), the bits are consecutively evaluated bit-by-bit according to the process described above in the flow chart of FIG. 1B, for example.

The control block 209 receives an input clock, Sampling Clock in FIG. 2, used to sample the input signal and to initialize the conversion method. The further signals, controlling the conversion procedure, including the comparator clock, are derived from the comparator outputs. The SAR block 205 may hold the values of the converted bits and control the capacitors top plate switches, as shown in FIG. 3, of the switched capacitor DAC 201.

The metastability detector 207 generates and stores indicators (flags) for the bits the evaluation of which has taken an extended time. This situation occurs when the voltages at the inputs of the comparator 203 are very close to each other. Such condition actually indicates that the conversion method has found the value of the signal to be converted and all the values of the consecutive bits should be complementary to the value of the bit with the metastability condition. If the conversion procedure is successfully finalized and all the bits including LSB are evaluated, the flags stored in the metastability detector 207 are ignored. However, if the evaluation of the bit with metastability takes so much time that evaluation of some of the consecutive bits have not been finalized, for this case, all the bits values, which have been evaluated, are used, while the rest of the bits are calculated.

Figure 3:
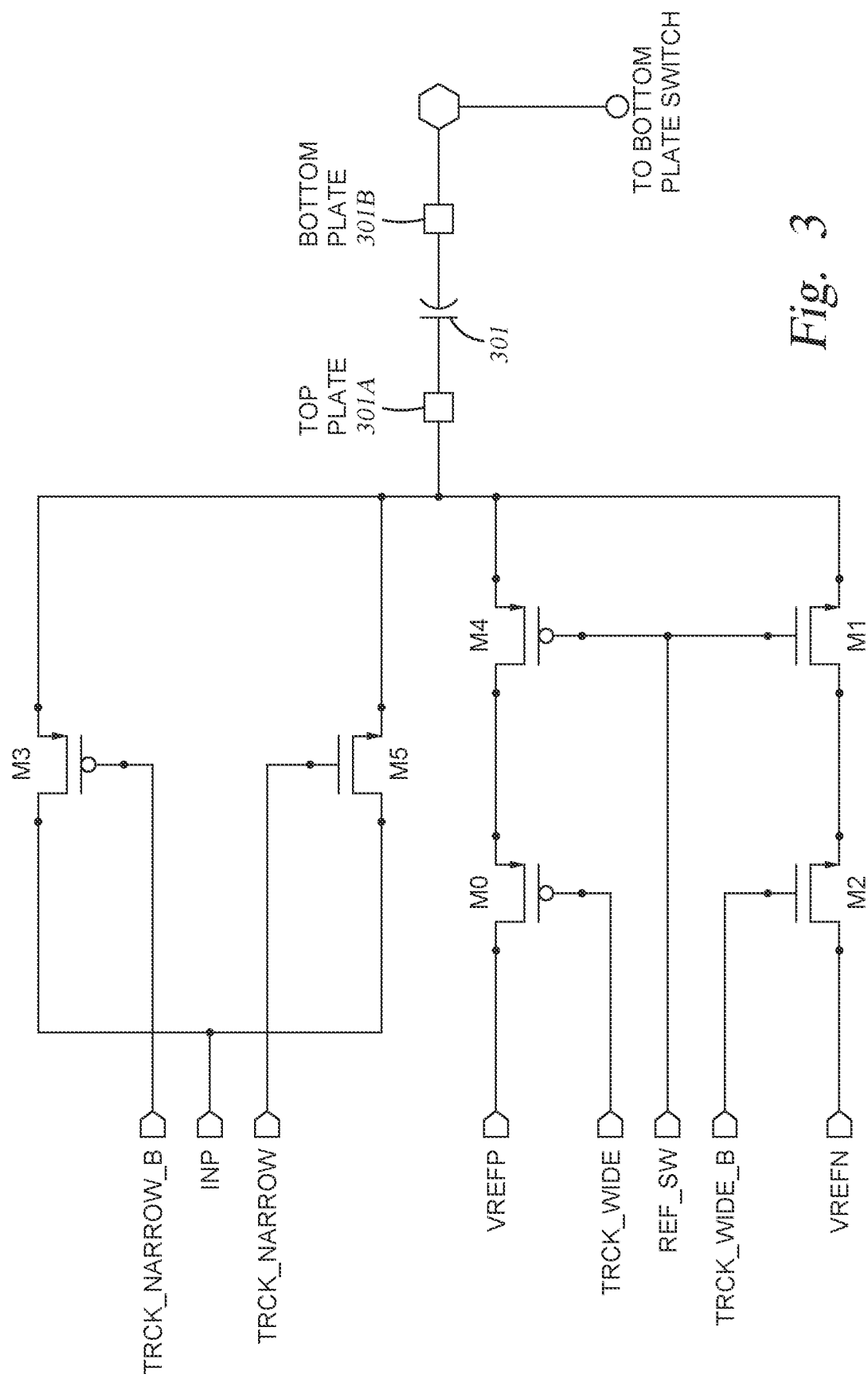
FIG. 3 illustrates an example of a switched capacitor cell, in accordance with an example embodiment of the disclosure.

FIG. 3 illustrates an example of a switched capacitor cell, in accordance with an example embodiment of the disclosure. Referring to FIG. 3, there are shown transistors M0-M5 and a capacitor 301 with a top plate 301A and a bottom plate 301B. The transistors M0-M5 may comprise CMOS transistors, as shown in FIG. 3, but the disclosure is not so limited, whereas other known transistors types may also be utilized. In FIG. 3, the transistors M0-M5 are utilized as switches for switching different voltages to the capacitor 301, for example.

The cell comprises a unit capacitor 301, where the bottom plate 301B of which may be interconnected with the other cells of the capacitor array and connected to one of the comparator inputs, which may be coupled via a switch such as switch 201A in FIG. 2, for example. The other plate of the capacitor, the top plate 301A, may be coupled to the switches, the transistors M0-M5. Two top transistors M3 and M5, coupling the top plate 301A of the capacitor 301 to the DAC input node INP, may be enabled during the tracking mode of operation when the voltage of the capacitor top plate 301A is tracking the DAC input signal. These transistors are controlled by complementary digital signals TRCK_NARROW and TRCK_NARROW_B.

Two CMOS switches M0 and M2 connected to reference voltages VREFP and VREFN are disabled by logically equivalent but wider signals TRCK_WIDE and TRCK_WIDE_B to avoid shoot-through currents between the input signal source and reference voltage generator outputs. After the completion of the track mode and sampling the input signal, the top plate 301A of capacitor 301 may be connected to one of the reference voltage nodes depending on the value of the digital control signal REF_SW generated by SAR 205 shown in FIG. 2. A similar circuit to that shown in FIG. 3 may be utilized for the other input INN of FIG. 2.

Figure 4:
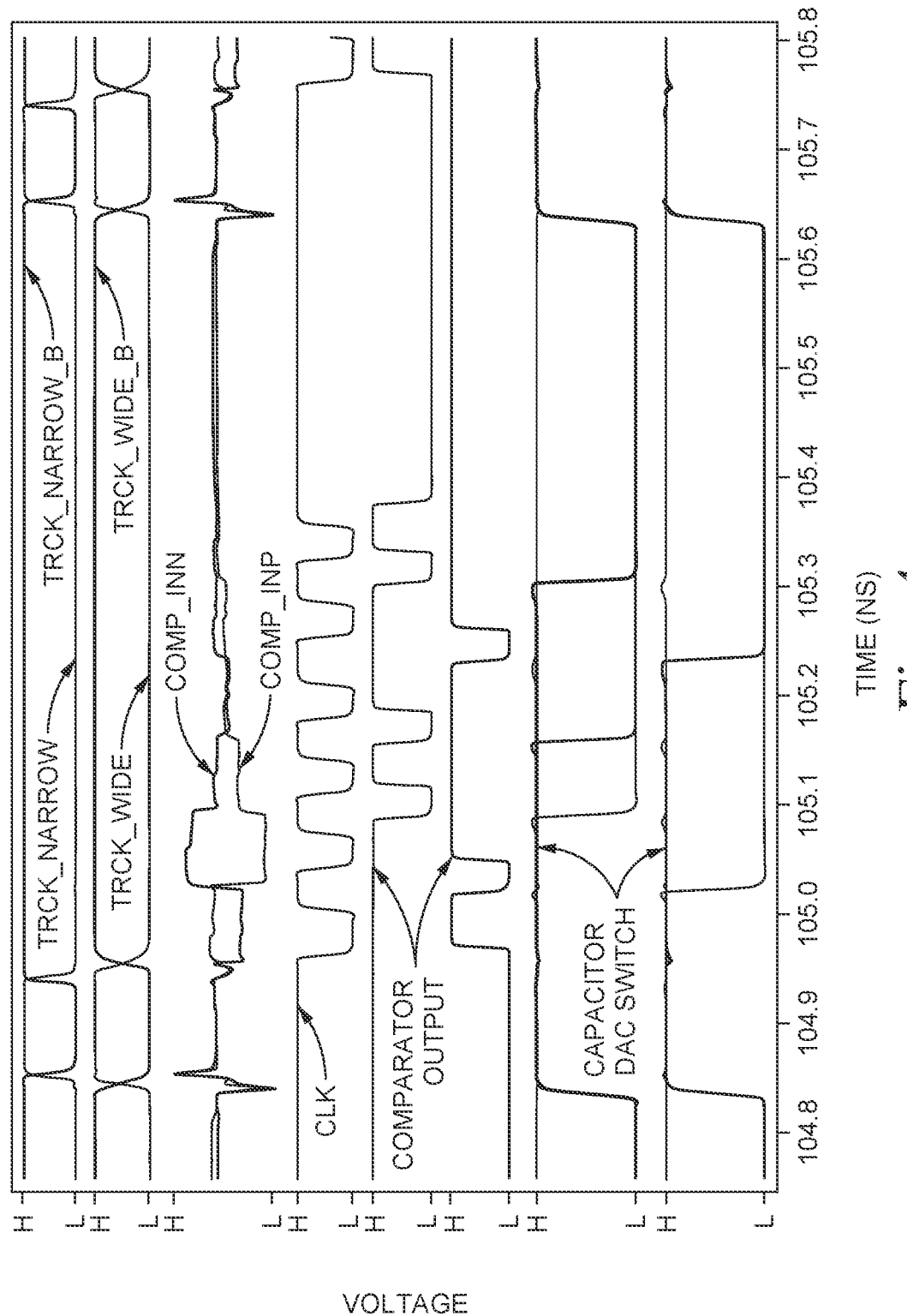
FIG. 4 illustrates timing diagrams for a SAR ADC, in accordance with an example embodiment of the disclosure.

FIG. 4 illustrates timing diagrams for a SAR ADC, in accordance with an example embodiment of the disclosure. The main control signals of the SAR ADC are depicted. The conversion cycle starts with the tracking clock signal CLK enabling the ADC, tracking the input signal (time 104.85 ns). At this moment all the outputs of SAR are reset to HIGH state (rows 7 and 8). Narrow and wide complementary tracking clock signals are shown in the top two rows of the plot. During the tracking mode of operation, all the top plates of the capacitors of the capacitor DAC are coupled to the ADC input nodes, i.e., TRCK_Narrow is HIGH so that M5 in FIG. 3 is ON, and input INP is coupled to the top plate 301A, with a similar situation in complementary transistor M3 of the circuit of FIG. 3. At the same time transistors M0 and M2 are turned off, thus disconnecting capacitor 301 from the reference voltage pins VREFP and VREFN. The common bottom plate switch, such as switch 201A in FIG. 2, to which the bottom plates of the DAC capacitors and the comparator amplifier differential inputs are connected all together, is closed, therefore all the capacitors of the DAC are pre-charged to the ADC input voltage, e.g., from inputs INN and INP. At the sampling moment, the bottom plate switch of the capacitor array opens first, and then the top plates of all capacitors of the array are disconnected from the ADC input nodes ending the tracking mode.

After the end of the tracking mode (time 104.95 ns), the top plates of the capacitors of the switched capacitor DAC are connected to the reference voltage sources VREFP and VREFN using TRCK_Wide and TRCK_Wide_B and REF_SW. One half of the cells in each binary weighted bit switched capacitor cell group is connected to VREFP while the other half is connected to VREFN. The group representing the least significant bit (LSB) might consist only of one capacitor cell. In this case both LSB cells of the differential DAC should be connected to the same reference voltage either VREFP or VREFN. After the capacitors top plates are reconnected from the DAC input nodes to the reference voltage sources, the differential voltage at the comparator input, shown in third row of the plot, becomes approximately equal to the sampled input voltage but with the opposite polarity. At the same time the comparator clock, depicted in the fourth row of the plot, enables the comparator reset mode. Both comparator outputs are reset to HIGH state (time 105 ns), as shown in the fifth and sixth rows of the plot. After this moment, the comparator is ready to evaluate the value of the most significant bit (MSB). The comparator clock CLK shown in row 4 of the plot rises, enabling the comparator, then the comparator evaluates the polarity of the DAC differential output signal and produces its output: one of the comparator outputs falls (time 105.05 ns) as indicated in row 6 of the plot.

The SAR 205 uses the comparator outputs (rows 5 and 6) to control the respective switches of the capacitor DAC (rows 7 and 8). Depending on the polarity of the comparator output, one half of the respective bit capacitor group (MSB in this particular case) is reconnected by the SAR 205 to the opposite reference voltage value (VREFP or VREFN) while the respective half of the group of capacitors of the opposite part of the differential capacitor DAC is reconnected to a reference voltage of the opposite polarity, thus changing the comparator differential input voltage by one MSB value (row 3, time 105.05 ns). The connections of the other halves of the group of capacitors are unchanged.

At the same time, the control block 209 detects the comparator output, turns the clock signal LOW and puts the comparator into a reset mode. After ending the reset mode and after the comparator input differential voltage settles to the new value, the comparator 203 is ready to evaluate the next bit, and the comparator clock (CLK, fourth row) rises enabling the comparator. This procedure is repeated for all the less significant bits capacitor groups except for the bit 1 capacitor cell, which might contain only one capacitor. In this case only one capacitor of the differential DAC is interconnected between VREFP and VREFN. The differential comparator may be operable to cancel the effect of an insignificant change of its input common mode voltage associated with such asymmetric switching. After the evaluation of the LSB, there is no need for any capacitor switch. The conversion is completed after the comparator evaluates its input that is created by all the previous switching of the capacitors of the DAC.

During and after the LSB evaluation, the comparator clock may be locked in a high state, which enables adding all the time allocated for the ADC input signal tracking to the LSB evaluation cycle. Comparator topologies often use dynamic amplifier stages that are sensitive to the comparator input signal only during a short initial time interval of the active phase of the comparator clock. After the short active phase, the amplifier transistors normally go in triode or off mode of operation depending on the actual implementation. During this time, still being in a regenerative mode of operation, the comparator latch may be isolated from the comparator input, processing its internal nodes voltage difference generated by the dynamic amplifier during its active phase. This can take an extended time. If the comparator clock is held in an active state (for instance HIGH) during the tracking of the ADC input signal, as shown by CLK being high until 104.95 ns, the comparator latch can use all this time to get out of the regenerative phase, or metastability condition, as well as the ADC sampled input signal will not be polluted by comparator kick-back noise generated by the comparator clock transition. This feature allows allocating more time for the evaluation of the more significant bits.

If the input voltages of the comparator of an asynchronous SAR ADC are too close to each other, the comparator latch can stay abnormally long in a regenerative mode (metastability condition), leaving not enough time for evaluation of less significant bits. On the other hand, if this condition occurs, the rest of the bits should be just complementary to the bit of the metastability. To tag a bit with metastability, the duration of the comparator clock pulses is compared with a timing interval generated by a special timer clocked by the comparator clock. If the evaluation of any bit takes more time than the time interval of the timer, the timer is able to produce a pulse, which is used to mark this specific bit.

At the end of the symbol conversion cycle, if the LSB is not evaluated, the word completion algorithm finds the bit marked with the metastability flag and assigns the opposite value to the rest of the lower significance bits. If the bit marked with the metastability flag is not completely finalized, it can be assigned with any value as long as the rest of the bits are assigned with the opposite value. The algorithm produces a completed evaluated word Bout<(n-1):0>.

Figure 5A:
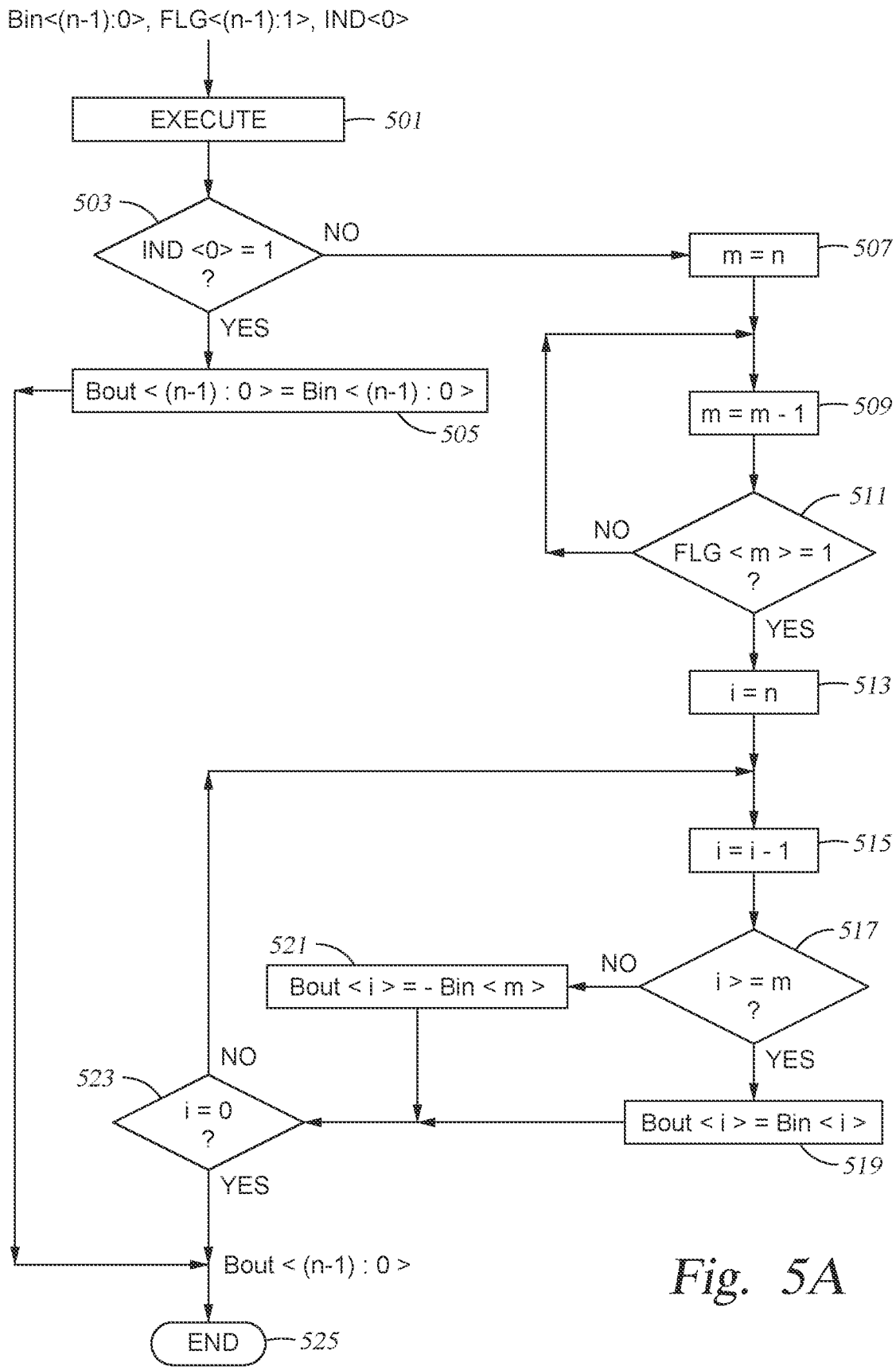
FIG. 5A is a flow chart illustrating SAR ADC word completion, in accordance with an example embodiment of the disclosure.

FIG. 5A is a flow chart illustrating SAR ADC word completion, in accordance with an example embodiment of the disclosure. Referring to FIG. 5A, there is shown a SAR ADC word completion starting in Execute step 501 with the input set of the evaluated bits Bin<(n-1):0>, set of metastability flags FLG<(n-1):1> and the LSB conversion indicator bit IND<0>. In step 503, if IND<0>=1, the process continues with step 505, where Bout<(n-1):0> are set to Bin<(n-1):0>. If IND<0> is not equal to 1, the process continues with step 507, where counter m is set equal to n before proceeding to step 509 where m is decremented by 1. In step 511, if the flag FLG<m> is not equal to 1, the process returns to step 509 to again decrease m by 1. When FLG<m> is equal to 1, the process continues with step 513 where counter i is set to n and decreased by 1 in step 515. In step 517, if i is greater than or equal to m (the metastability flag index found in step 511), Bout<i> is set to Bin<i> in step 519, and if not, all the rest of Bout<i> are set to –Bin<m> in step 521.

The process continues with step 523, which returns the process to step 515 if i does not equal zero, and if so, the process completes at step 525.

Implementation of this word completion method utilizes an additional timer, which is synchronized with the comparator clock and tuned to the comparator latch delay time. Due to the process, temperature variation, and mismatch of the components, it is difficult to match the duration of this special time interval with the time needed for the latch to get out of the metastability condition.

Figure 5B:
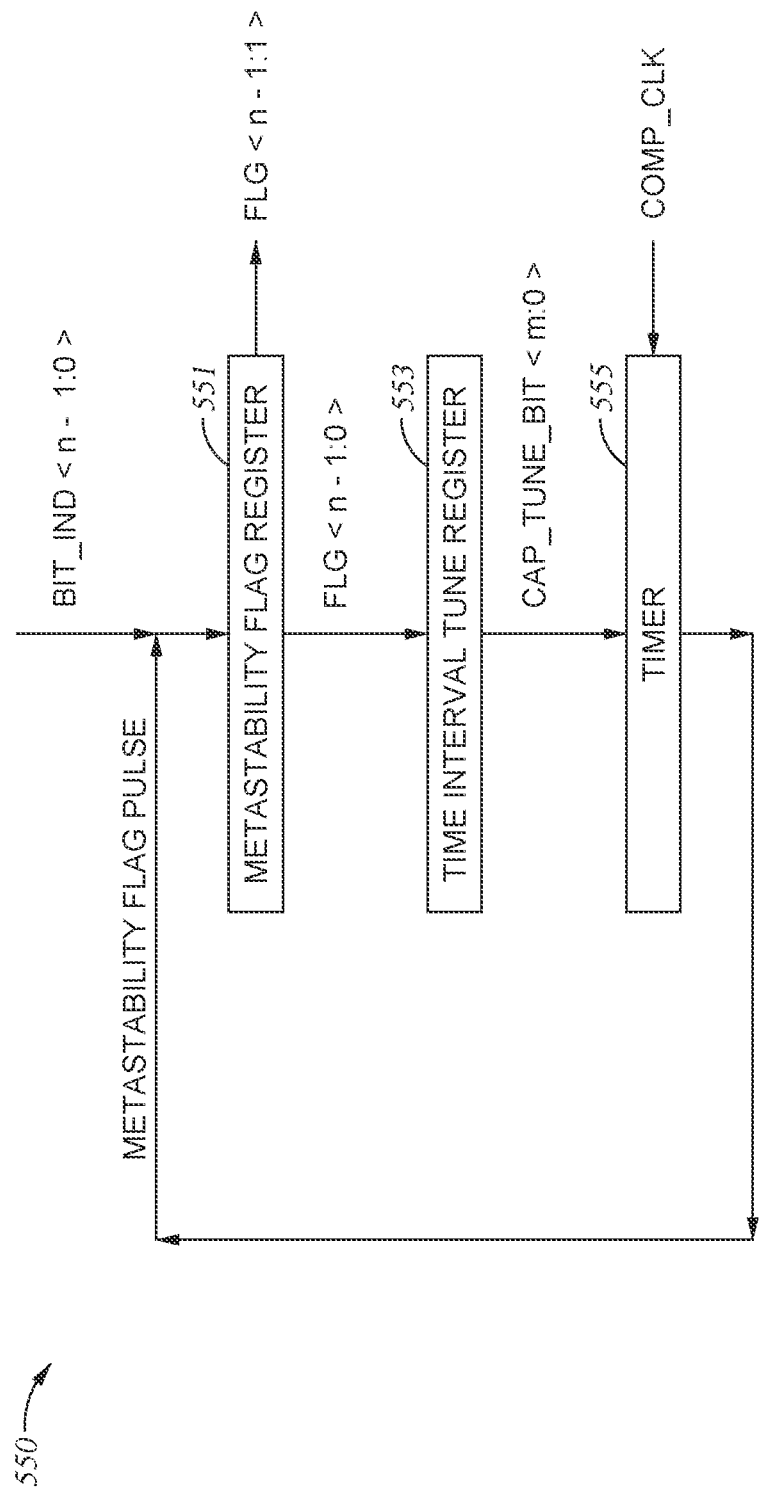
FIG. 5B illustrates a block diagram of a metastability detector, in accordance with an example embodiment of the disclosure.

FIG. 5B illustrates a block diagram of a metastability detector, in accordance with an example embodiment of the disclosure. Referring to FIG. 5B, there is shown metastability detector 550 comprising a metastability flag register 551, a time interval tune register 553, and a timer 555. The metastability detector 550 may be substantially similar to the metastability detector 207 described with respect to FIG. 2. Input signals may comprise BIT_IND<n-1:0> and comparator clock COMP_CLK, while FLG<n-1:1> comprises an output of the metastability detector 550.

The block contains a tunable timer circuit controlled by the comparator clock, CLK in FIG. 2. If the clock interval is longer than the time interval of the tunable timer 555, the timer 555 generates a metastability flag pulse which is stored in the metastability flag register 551. At the same time, the register also receives the pulses indicating the number of the bits being converted at the time in order to correspond the generated metastability flags to the converted bit numbers. All the metastability flags, except the LSB flag, (FLG<n-1:1>) may be sent to the word completion block 211 described with respect to FIG. 2. The time interval tune register 553 uses all the metastability flags including the LSB flag (FLG<n-1:0>) to perform the background calibration of the timer time interval during the normal operation of the ADC as it will be described below. The timer 555 is shown in further detail in FIG. 6.

Figure 6:
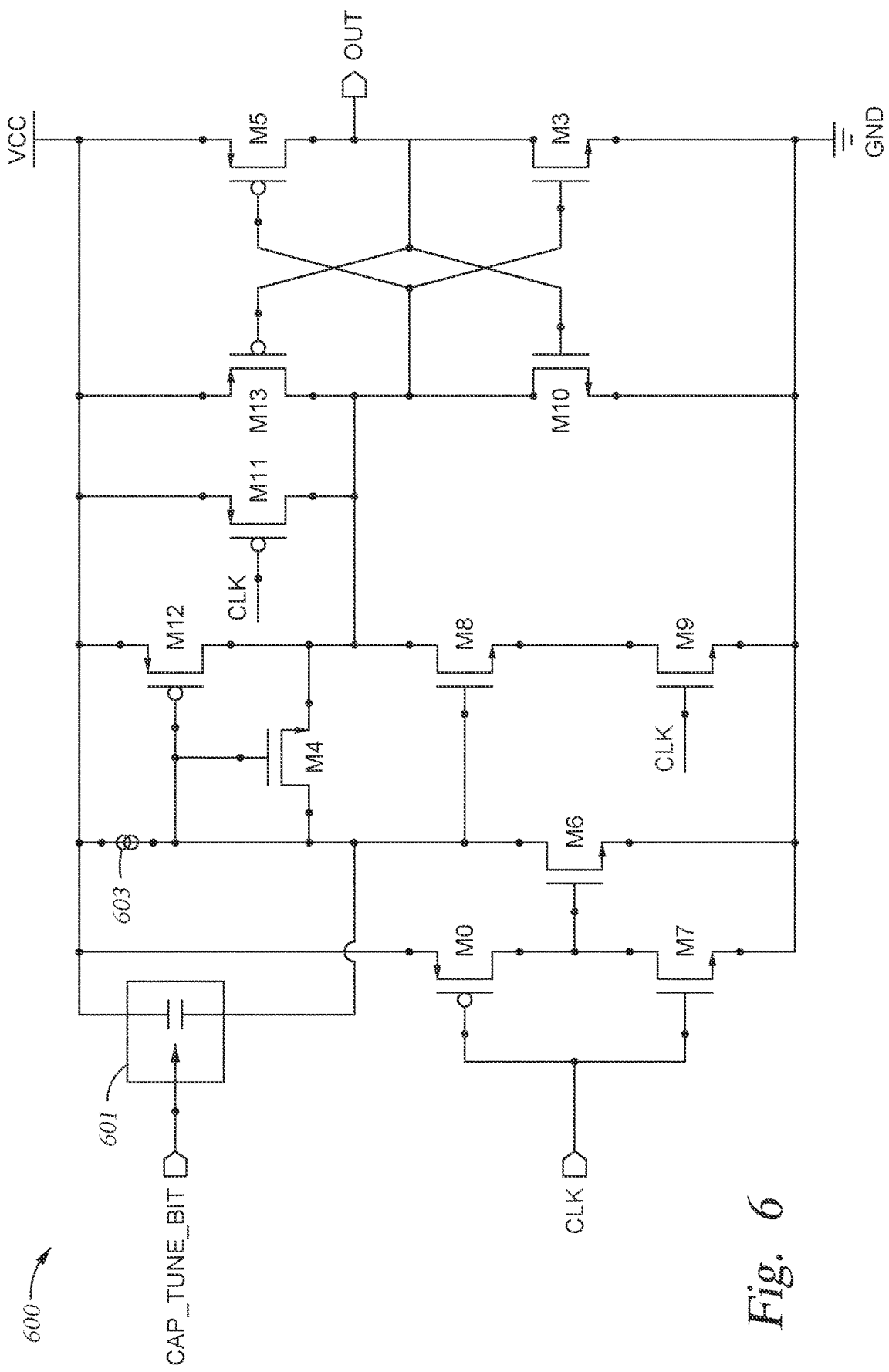
FIG. 6 is a schematic of a timer that can be used for flag generation, in accordance with an example embodiment of the disclosure.

FIG. 6 is a schematic of a timer that can be used for flag generation, in accordance with an example embodiment of the disclosure. Referring to FIG. 6, there is shown timer 600 comprising a tunable capacitor 601, a DC current source 603, current switching transistor M6 and remaining transistors comprising a Schmitt trigger with a reset option. The tunable capacitor 601 may comprise an array of capacitors, for example, selectable by a control signal, Cap_Tune_Bit that may enable/disable switches in the capacitor array. The transistors M0-M13 may comprise CMOS transistors, for example, although other types of transistor are possible. There is also shown power supply voltage, VCC and ground, GND. The current source 603 may comprise circuitry for providing a configurable amount of current, in this case for charging the tunable capacitor 601.

When the input clock, CLK, is LOW, the voltage at the drain node of transistor M6, which is connected to the input node of the Schmitt trigger, gates of M8 and M12, as well as the trigger output, OUT, are reset to zero. When the clock goes HIGH, transistor M6 turns off and the current, generated by the current source 603, starts to charge the tunable capacitor 601. When the voltage at the trigger input, M8/M12 gates, reaches the tripping point, the trigger output goes HIGH. The duration of the pulse generated by the timer 600 is controlled by the digital input CAP_TUNE_BIT, which in this example is a 5 bit signal <4:0>.

The time interval is background calibrated during normal operation of the SAR ADC. The timer duration is controlled by an accumulating register, which is updated at the end of each symbol conversion as illustrated by the flow chart depicted in FIG. 7.

Figure 7:
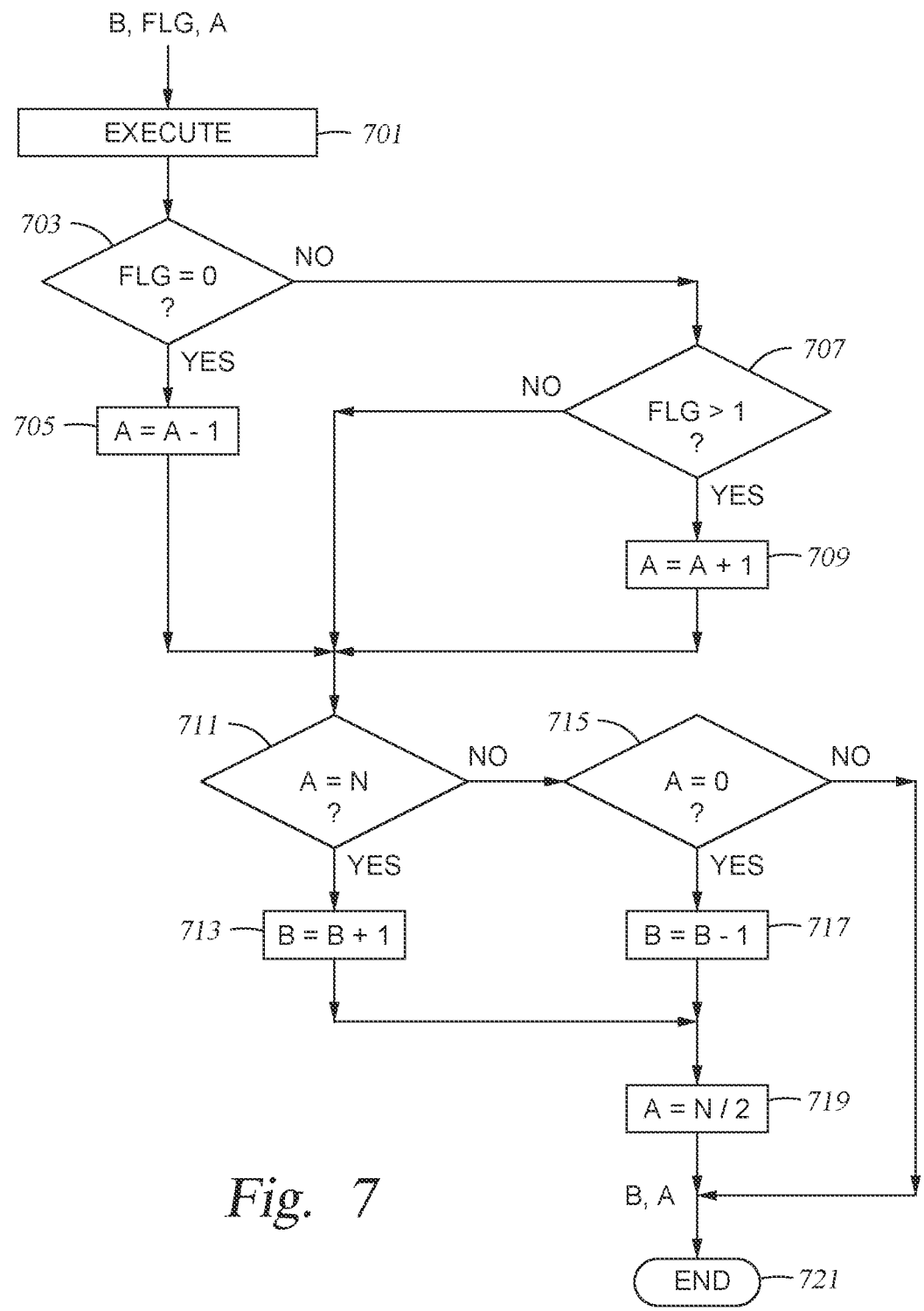
FIG. 7 is a flow diagram for a timing interval calibration algorithm, in accordance with an example embodiment of the disclosure.

FIG. 7 is a flow diagram for a timing interval calibration algorithm, in accordance with an example embodiment of the disclosure. The process operates with the current value of the digital control signal B (this signal is an equivalent of CAP_TUNE_BIT<m:0>, which is stored in the Time Interval Tune Register 553), number of flags, FLG, generated by the timer during the symbol conversion, and the current value of the accumulator A. The accumulator A may be stored in the time interval tune register 553 described with respect to FIG. 5, for example. The process begins with execute step 701 proceeding directly to step 703, where the number of flags is assessed. If no bit is flagged at all, i.e., FLG=0, one bit is subtracted from the accumulator register content A in step 705 before proceeding to step 711. If the number of flags is not zero, the process continues to step 707, where if more than one bit is tagged during one conversion cycle (FLG>1), one bit is added to the accumulator register content A in step 709 before proceeding to step 711, and if only one bit gets tagged during the conversion cycle, the accumulator content remains unchanged and proceeds to step 711.

If, in step 711, accumulator A reaches the saturation value N, one bit is added to digital control signal B in step 713, thus increasing the timer pulse duration, and the accumulator A is reset to the initial value N/2 in step 719, followed by end step 721. If accumulator A is not the saturation value N in step 711, the process continues with step 715, where if accumulator A reaches all zero value, one bit is subtracted from digital control signal B in step 717, thus reducing the timer pulse duration, and A is also reset to the initial value N/2 in step 719 followed by end step 721.

Two important parameters are the longest and the shortest time this algorithm can provide. The shortest duration time will be achieved in instances where multiple symbols are being evaluated, and no flags are generated at all. For all the MSBs, this condition can be achieved easily, thus it is useful to focus only on the LSB. The highest possible comparator input voltage value for the LSB is +−ΔV(LSB) if during the evaluation of the all previous more significant bits, the comparator input voltage is also greater than +−ΔV(LSB), where ΔV(LSB) is the value of one LSB voltage step. If this condition happens multiple times, the timer will get tuned to the value of one LSB step voltage, which is a desirable accuracy target.

The longest delay time will be achieved in instances where multiple consecutive symbols are being evaluated, and at least two flags are generated. This happens when both one of the MSB input voltage and the input voltage of the LSB are low during the same symbol conversion. It is understood that each of those signals individually can be indefinitely small, however they both cannot be indefinitely small during the same symbol conversion cycle because of the following relationship imposed by the ADC conversion algorithm:

$$|Vin(MSB)-Vin(LSB)|>=\Delta V(LSB)$$

where Vin(MSB) is the comparator input voltage during evaluation of any more significant bits and Vin(LSB) is the comparator input voltage during evaluation of the LSB. This condition limits the minimal simultaneous voltage value to +/−0.5 ΔV(LSB). Thus, the proposed calibration algorithm places the timer pulse duration within the following limits:

$$T(\Delta V(LSB))=<Ttimer=<T(0.5\Delta V(LSB)), \text{ thus}$$

$$Ttimer\approx T(\Delta V(LSB))$$

where T(ΔV(LSB)) is the time needed for the comparator with the input voltage +/−ΔV(LSB) to produce a valid output.

This condition sets the target limits for the comparator input voltage value causing the generation of a metastability flag for the input voltage slightly less than +−ΔV(LSB) that is equal to the ADC resolution. Normally this condition of a perfect matching is achieved during the first few tens or hundreds of conversion cycles.

Figure 8:
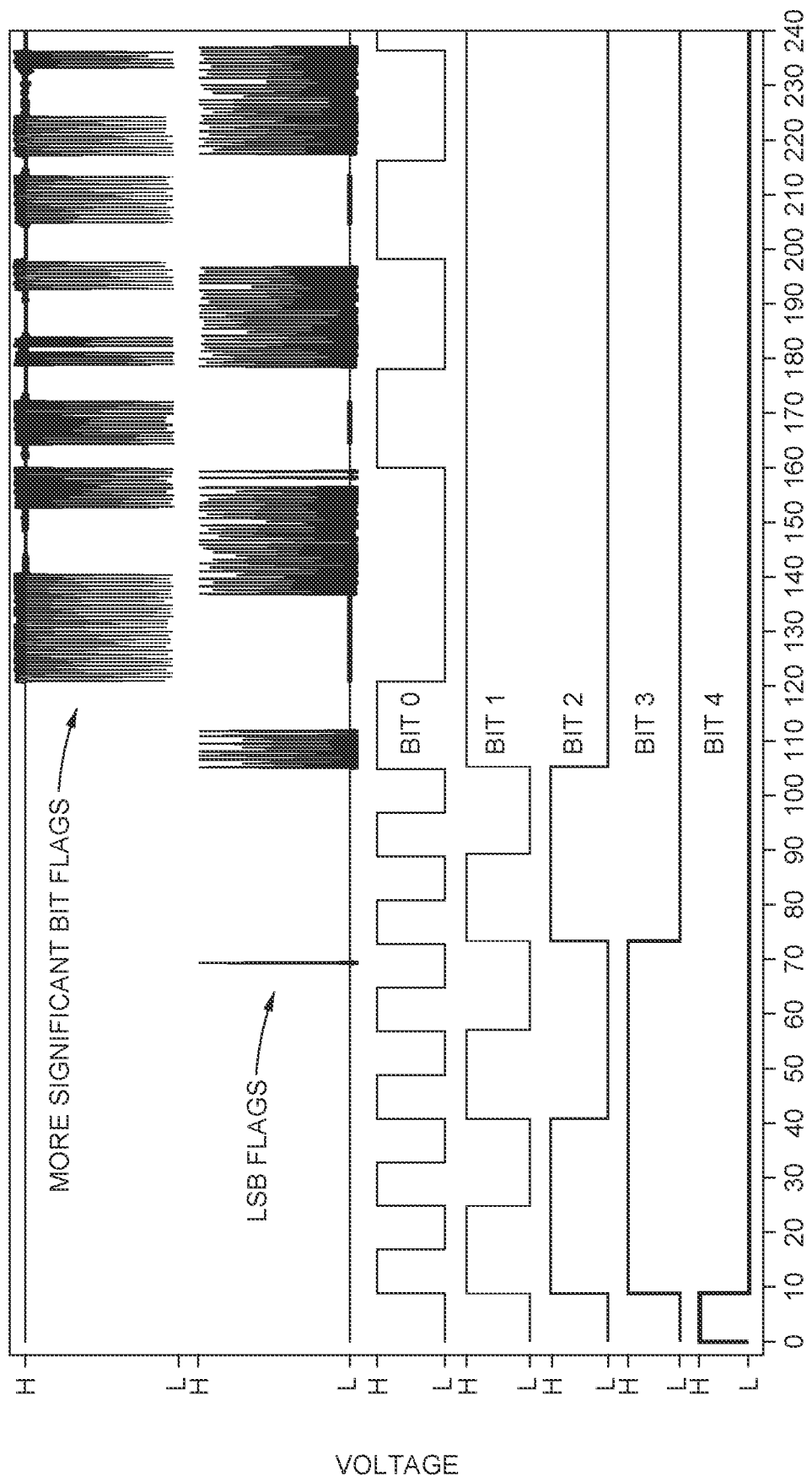
FIG. 8 illustrates the word completion algorithm functionality of a SAR ADC, in accordance with an example embodiment of the disclosure.

FIG. 8 illustrates the word completion algorithm functionality of a SAR ADC, in accordance with an example embodiment of the disclosure. The first row of FIG. 8 contains a superposition of all more significant bit flags except the LSB. The flags are active LOW. The second row contains only the LSB flags. They are active HIGH. The other five rows (3-7) show the bit content of the timer interval control register. For the initial 12 ns of the ADC operation, no metastability flags are generated (first and second row). Thus, the algorithm is continuously reducing the bit content of the register in order to reduce the time interval of the timer. After 105 ns, the timer starts to generate metastability flags, and the bit content of the timer interval control register stabilizes.

Figure 9:
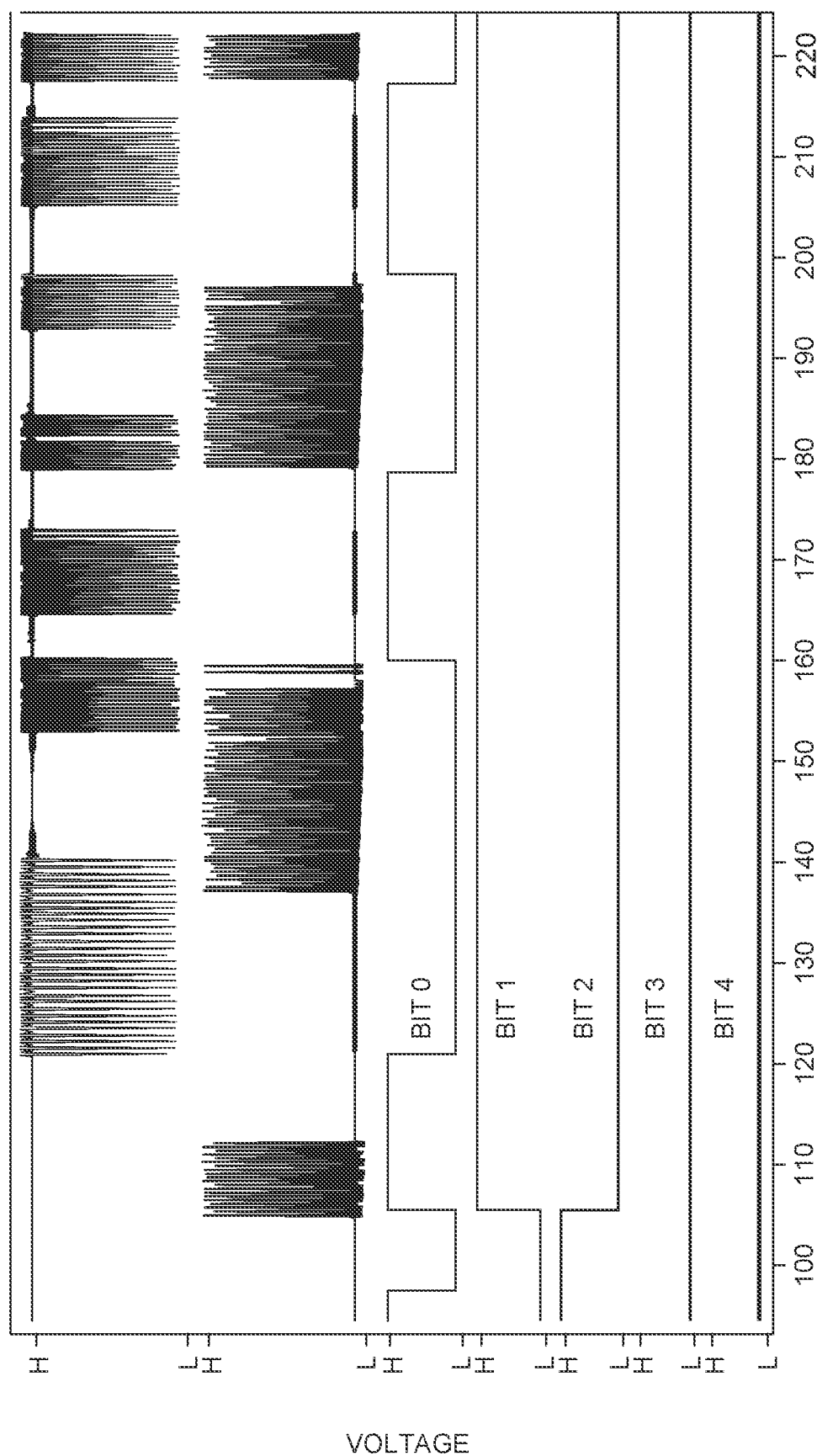
FIG. 9 is a close up view of the time interval [100 ns:220 ns] for the SAR ADC, in accordance with an example embodiment of the disclosure.

FIG. 9 is a close up view of the time interval [100 ns:220 ns] for the SAR ADC, in accordance with an example embodiment of the disclosure. It is apparent that if for a significant number of conversion cycles there are no generated flags (intervals [110:120], [160:180], [200:220]), the register bit content is reduced by one bit. On the other hand, if for a significant number of conversion cycles flag zero (second row) and another flag (first row) are generated within the same conversion cycle (intervals [155:160 ns], [180:200 ns]), the counter bit content is increased by one bit. The value of one LSB corresponds to ~2 ps in this specific case. It is understood that by design, this value can be set to any arbitrary value, either greater or smaller. Thus, the LSB toggling should not make any significant influence on the operation of the word completion block since the margin for the one sample typical conversion cycle time of a SAR ADC should be significantly greater in order to ensure a reliable SAR ADC functionality within the process, power supply voltage and operating temperature variation. For instance, in FIG. 4 this margin is presented by the time interval from 105.4 ns, when the evaluation of the LSB started, through 105.63 ns, when the track mode started, thus making the margin value equal to 230 ps.

The word completion algorithm functionality shown in FIGS. 8 and 9 confirms that, if two metastability flags are generated during one symbol conversion cycle, the second flag always corresponds to the LSB. This happens only in the case if the conversion is successfully completed. Thus, if the conversion of a symbol is not finalized because of the metastability effect, the word completion block will be dealing only with one metastability flag.

The proposed method does not completely eliminate the conversion errors caused by the metastability effects in the comparator latch or in the registers of the ADC. The resulting probability of the error is the product of the error probability caused by the comparator latch and the probability of the error in the metastability detector along with the word completion block. Reducing the error rate caused by the latch would require allocation of more time for the conversion, thus reducing the ADC conversion rate. On the other hand, in order to reduce the second error component, more time should be allocated for the transfer of the converted bits to the output interface. This would increase only the latency of the ADC that can be tolerated in the most applications.

In an example embodiment of the disclosure, a method and system is described for an asynchronous successive approximation register analog-to-digital converter with a word completion algorithm. The method and system may comprise a successive approximation register analog-to-digital converter (SAR ADC) comprising a plurality of switched capacitors, a comparator, a metastability detector comprising a timer having a tunable time interval, and a successive approximation register: sampling input signals at inputs of the plurality of switched capacitors; comparing, by the comparator, signals at outputs of the plurality of switched capacitors, sensing whether a metastability condition exists for the comparator using the metastability detector timer and setting a metastability flag upon each metastability detection for each bit to be evaluated; increasing a value of the tunable time interval if more than one metastability flag is set during conversion of a sampled input signal; decreasing a value of the tunable time interval if no metastability flags are set; and using the flags for the word completion in the cases, when not all the bits have been evaluated, and configuring the output value of the SAR ADC based on a final value of the successive approximation register and word completion.

The SAR DAC may be operable to sample input signals at inputs of the array of switched capacitors, compare signals at outputs of the array of switched capacitors, update a content of the successive approximation register and change the connections of the switched capacitors between reference voltages, sense whether a metastability condition exists for the comparator using the metastability detector and set a metastability flag upon each metastability detection for each bit to be evaluated, use the flags for the word completion in the cases when not all bits have been evaluated, and configure the output value of the SAR ADC based on a final value of the successive approximation register and word completion. The SAR DAC may also increase the tunable time interval, if more than one metastability flag is set and decrease the tunable time interval if no metastability flags are set.

The SAR DAC may be operable to sample input signals at inputs of the array of switched capacitors, compare signals at outputs of the array of switched capacitors, each for a respective bit, sense whether a metastability condition exists for the comparator using the metastability detector and set a metastability flag upon each metastability detection for each bit to be evaluated until a word completion occurs, increase a value in the successive approximation register by one if more than one metastability flag is set, decrease a value in the successive approximation register by one if no metastability flags are set, and configure a timing of the SAR ADC based on a final value of the successive approximation register upon word completion.

The comparator may remain in an active evaluation mode high during a tracking mode of the SAR ADC as well as the active evaluation mode might be imposed on the comparator by setting the comparator clock to an active value during the tracking mode operation of the SAR ADC. The operation of the SAR ADC may be configured by communicating a signal representing the value of the successive approximation register to the array of switched capacitors. The metastability detector may comprise a metastability flag register, and a time interval tune register. The timer may comprise a tunable capacitor configured by the time interval tune register. The timer may receive a clock signal from the comparator. The metastability flag register may indicate the bit index number of metastability flags set in a word completion. The metastability flag register may be configured using a signal from the timer. The SAR ADC may be integrated in one or more complementary metal oxide semiconductor (CMOS) die.

The SAR ADC may comprise a word completion block, and if all bits have been evaluated, a content of the successive approximation register remains unchanged, whereas if not all the bits have been evaluated, the word completion block assigns values complementary to a bit of metastability to any missing bits.

In another example embodiment, a method and system is described for an asynchronous successive approximation register analog-to-digital converter with a word completion algorithm. The method and system may comprise a successive approximation register analog-to-digital converter (SAR ADC) comprising a plurality of switched capacitors, a comparator, a metastability detector comprising a timer having a tunable time interval, a word completion block, and a successive approximation register. The SAR DAC may be operable to: sample input signals at inputs of the plurality of switched capacitors; compare signals at outputs of the plurality of switched capacitors; sense whether a metastability condition exists for the comparator using the timer and set a metastability flag upon each metastability detection for each bit to be evaluated. A value of the tunable time interval may be increased if more than one metastability flag is set during conversion of a sampled input signal and a value of the tunable time interval may be decreased if no metastability flags are set. The metastability flags may be used for a word completion in the cases when not all bits have been evaluated, and the output value of the SAR ADC may be configured based on a final value of the successive approximation register and word completion.

The timer calibration method, described above, tunes the timer pulse duration within the following limits: T($\Delta$V(LSB))=<Ttimer=<T(0.5 $\Delta$V(LSB)). However, if the timer is calibrated to the pulse duration Ttimer T(0.5 $\Delta$V(LSB)), it becomes possible to extrapolate the value of one more bit beyond the LSB, combining the value of the evaluated LSB and the value of the metastability flag, associated with LSB evaluation. For the SAR ADC structure described above, and offset binary digital output coding scheme, the additional bit may be extrapolated as the exclusive OR (XOR) of the LSB value and the metastability flag value. A different logical relationship between the value of the extrapolated bit and combination of values of extracted LSB and metastability flag can be used for different SAR ADC topology and digital ADC output coding scheme.

Figure 10:
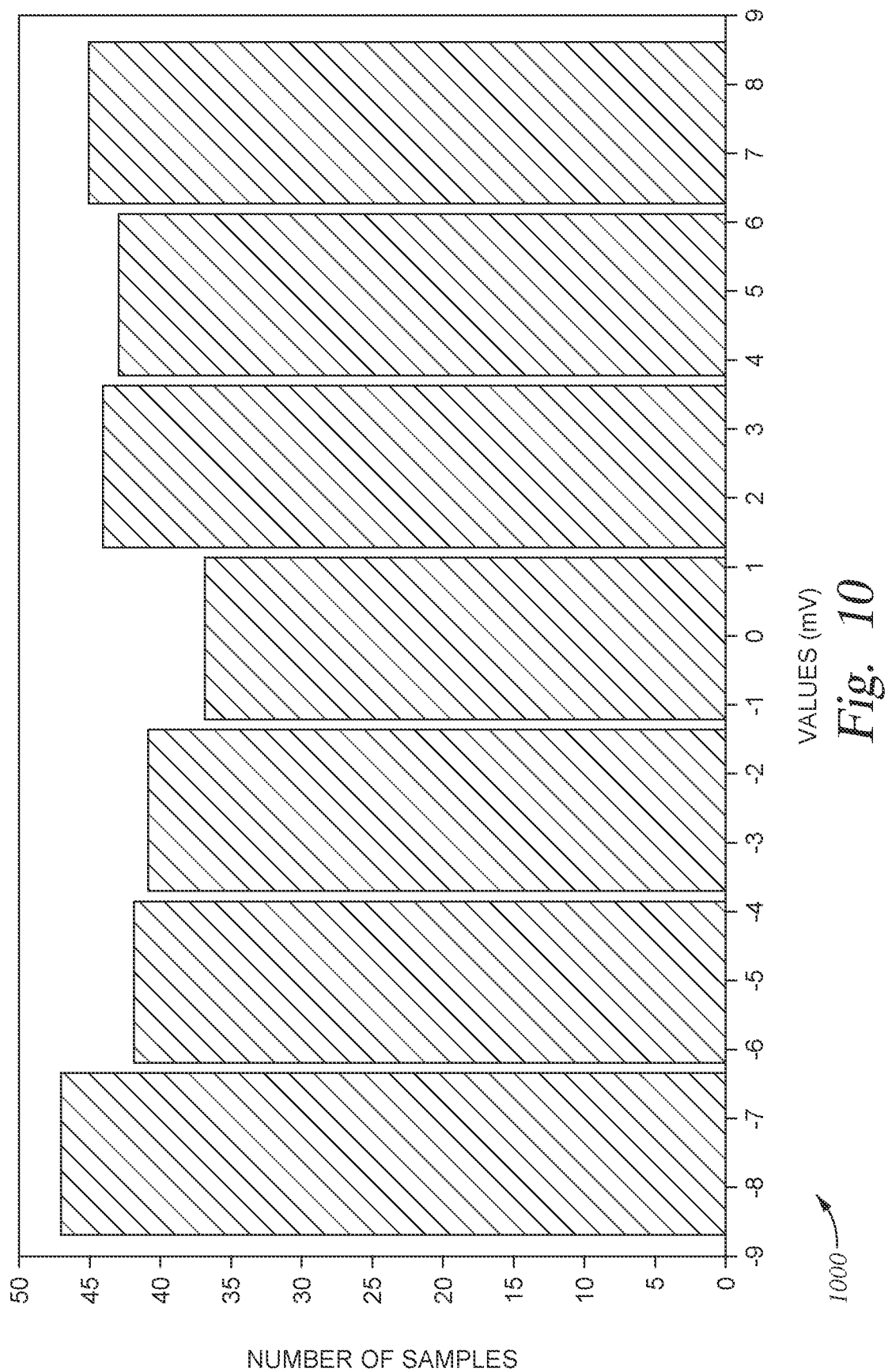
FIG. 10 illustrates an example comparator input voltage distribution, in accordance with an example embodiment of the disclosure.

FIG. 10 illustrates an example comparator input voltage distribution 1000, in accordance with an example embodiment of the disclosure. For example, the distribution 1000 may be the comparator input voltage distribution during evaluation of the LSB. The distribution may be approximately uniform if a random input signal is sampled and converted by the ADC. It is apparent that input voltage is precisely limited within +/−$\Delta$V(LSB). This feature provides an opportunity to tune the metastability flag timer to the value of the comparator input very close to +/−0.5 $\Delta$V(LSB). This result may be achieved, if during the evaluation of the LSB, the metastability flag is generated only in half of the cases and is not generated during the evaluation of the other half of the samples.

In some embodiments, the SAR ADC calibrates the timing interval for the metastability detector based on the metastability flag for the least significant bit (LSB). The metastability detector increments the accumulator value if this flag is not set and decrements the accumulator value if the flag is set. The accumulator value may be stored in the time interval tune register 553 described with respect to FIG. 5, for example. When the accumulator value reaches zero or the overflow limit (N), the metastability detector subtracts one bit or adds one bit to the digital control signal (B), respectively, which reduces or increases the timer pulse duration, respectively. In this manner, the SAR ADC calibrates the timing interval so that a metastability flag is generated for the LSB within +/−0.5 $\Delta$V(LSB). As a result, an additional bit past the LSB may be extrapolated as an EXCLUSIVE OR (XOR) of the LSB and the metastability flag.

Figure 11:
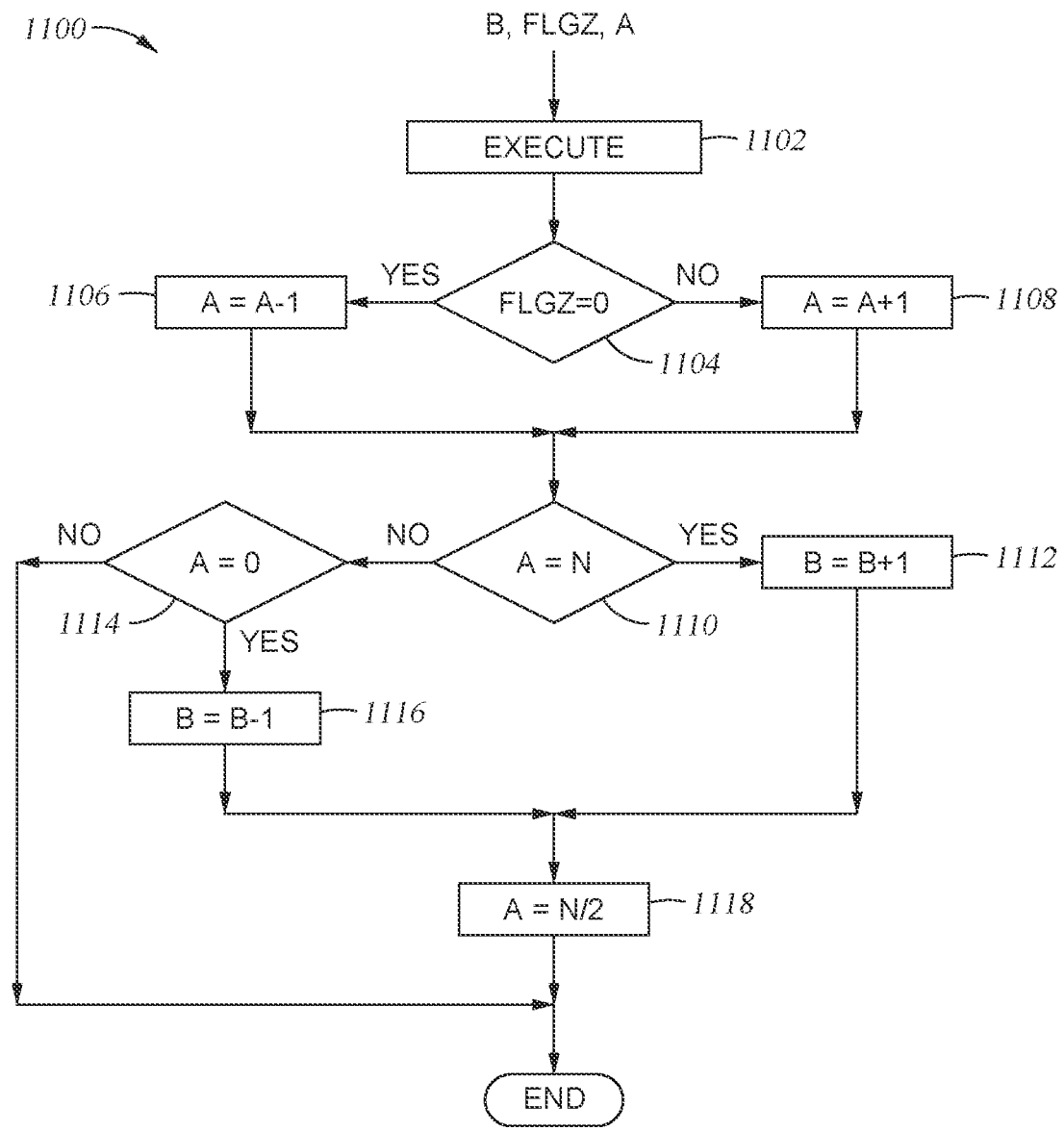
FIG. 11 is a flowchart of an example method of calibrating a timing interval, in accordance with an example embodiment of the disclosure.

FIG. 11 is a flowchart of an example method 1100 of calibrating a timing interval, in accordance with an example embodiment of the disclosure. In certain embodiments, the SAR ADC or the metastability detector perform the method 1100. By performing the method 1100, the SAR ADC or the metastability detector calibrate the timing interval so that a metastability flag is generated for the LSB within +/−0.5 ΔV(LSB).

In block 1102, the SAR ADC or the metastability detector begin with digital control signal (B), which is an equivalent of the input CAP_BIT<4:0>, FLGZ, which is the metastability flag value generated by the timer during evaluation of the LSB, and the current value of the accumulator (A). In block 1104, the SAR ADC or the metastability detector evaluate whether FLGZ is set. If FLGZ is not set (FLGZ=0), the SAR ADC or the metastability detector subtract one bit from the accumulator value (A). If FLAGZ is set (FLGZ=1), the SAR ADC or the metastability detector add one bit to the accumulator value (A).

In block 1110, the SAR ADC or the metastability detector determine whether the accumulator value (A) has reached an overflow limit (N) of the accumulator. If the accumulator value (A) has reached the overflow limit (N), then the SAR ADC or the metastability detector add one bit to the digital control signal (B), thereby increasing the timer pulse duration. If the accumulator value (A) has not reached the overflow limit (N), then the SAR ADC or the metastability detector determine whether the accumulator value (A) has reached zero in block 1114 (e.g., if one bit was subtracted from the accumulator value (A)). If the accumulator value (A) has reached zero, then the SAR ADC or the metastability detector subtract one bit from the digital control signal (B), thereby reducing the timer pulse duration. If the accumulator value (A) has not reached zero, then the SAR ADC or the metastability detector conclude the method 1100.

If the SAR ADC or the metastability detector added or subtracted one bit from the digital control signal (B) to adjust the timer pulse duration, the SAR ADC or the metastability detector set the accumulator value (A) to half the overflow limit (N) in block 1118. When a steady state condition is achieved, the metastability flags will be generated in only half of the cases.

Figure 12:
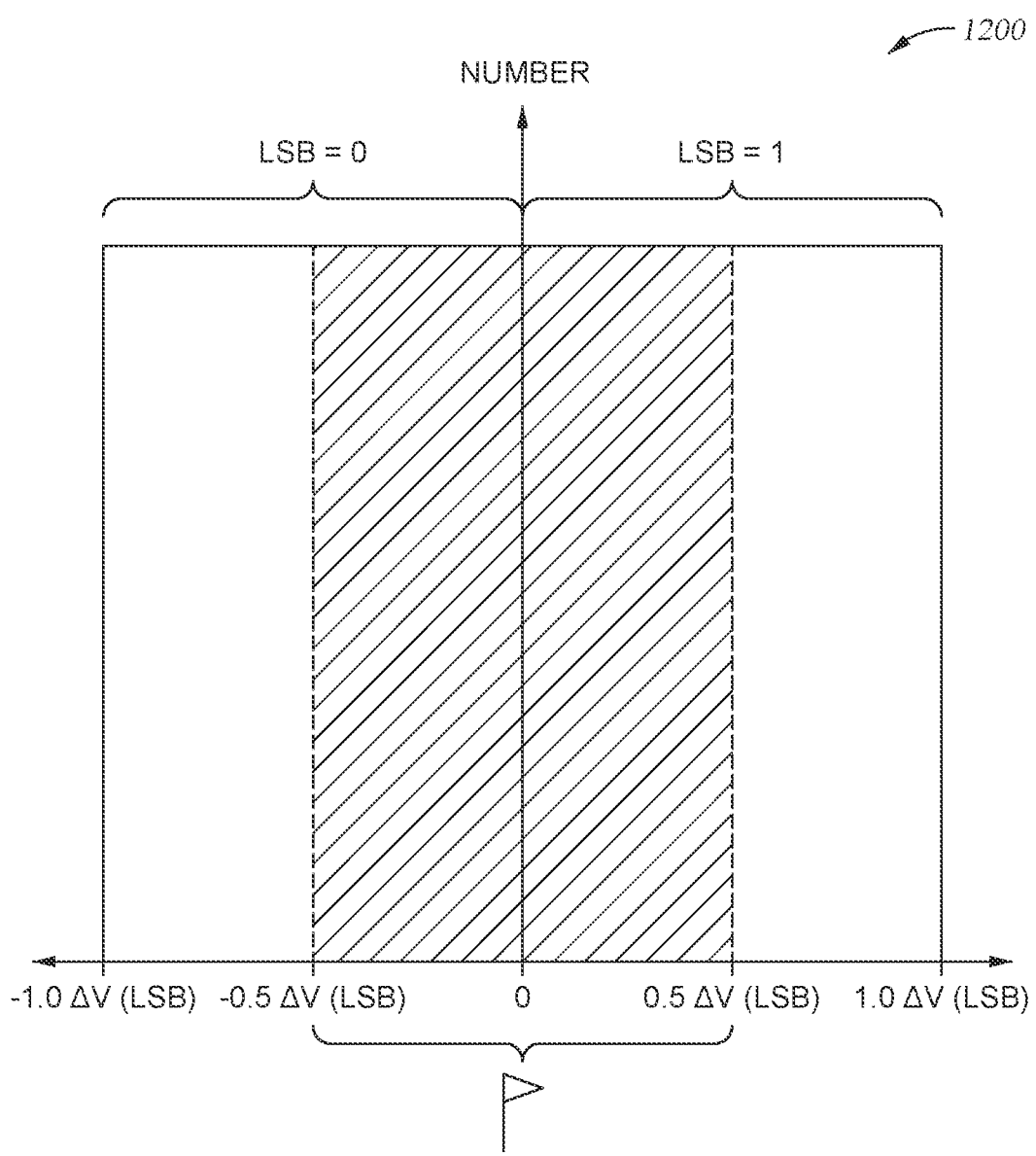
FIG. 12 illustrates an example metastability detection, in accordance with an example embodiment of the disclosure.

FIG. 12 illustrates an example metastability detection 1200, in accordance with an example embodiment of the disclosure. As seen in FIG. 12, the value of the LSB is 0 when the voltage is between 0 and −1 ΔV(LSB), and the value of the LSB is 1 when the voltage is between 0 and +1 ΔV(LSB). Additionally, the metastability flag is generated when the voltage is between −0.5 ΔV(LSB) and +0.5 ΔV(LSB). As a result, the metastability flag is generated in half of the cases.

Figure 13A:
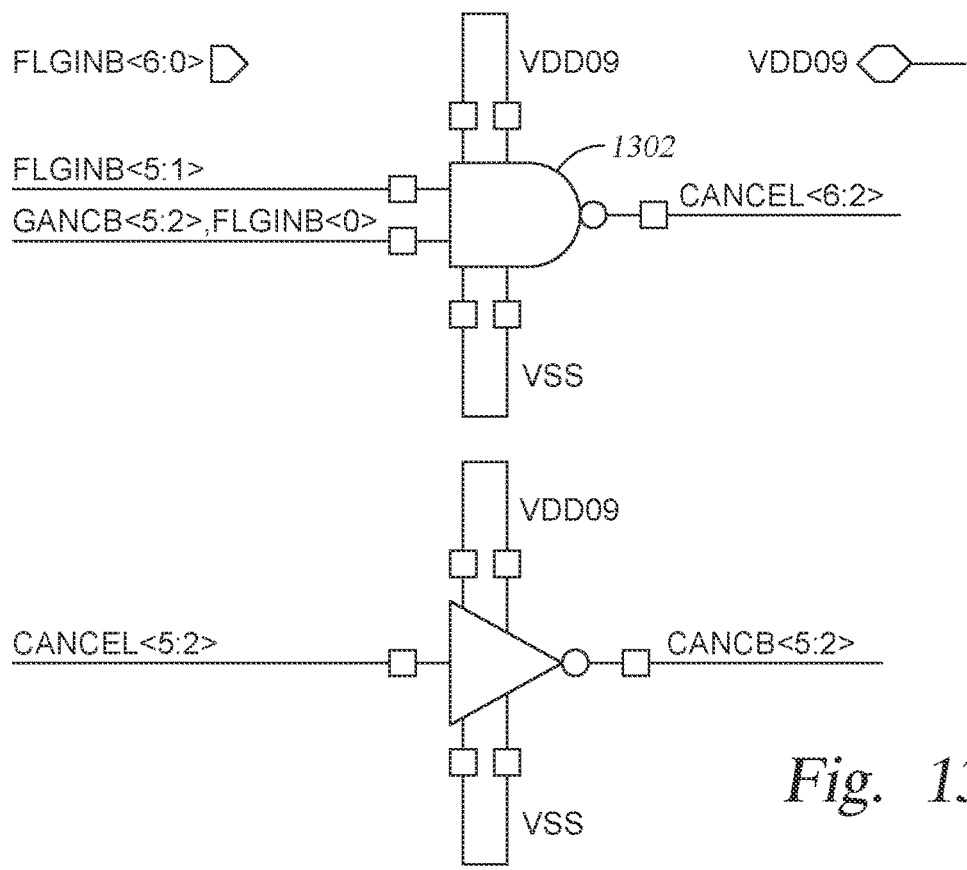
FIGS. 13A through 13E illustrate an example word completion block, in accordance with an example embodiment of the disclosure.
Figure 13B:
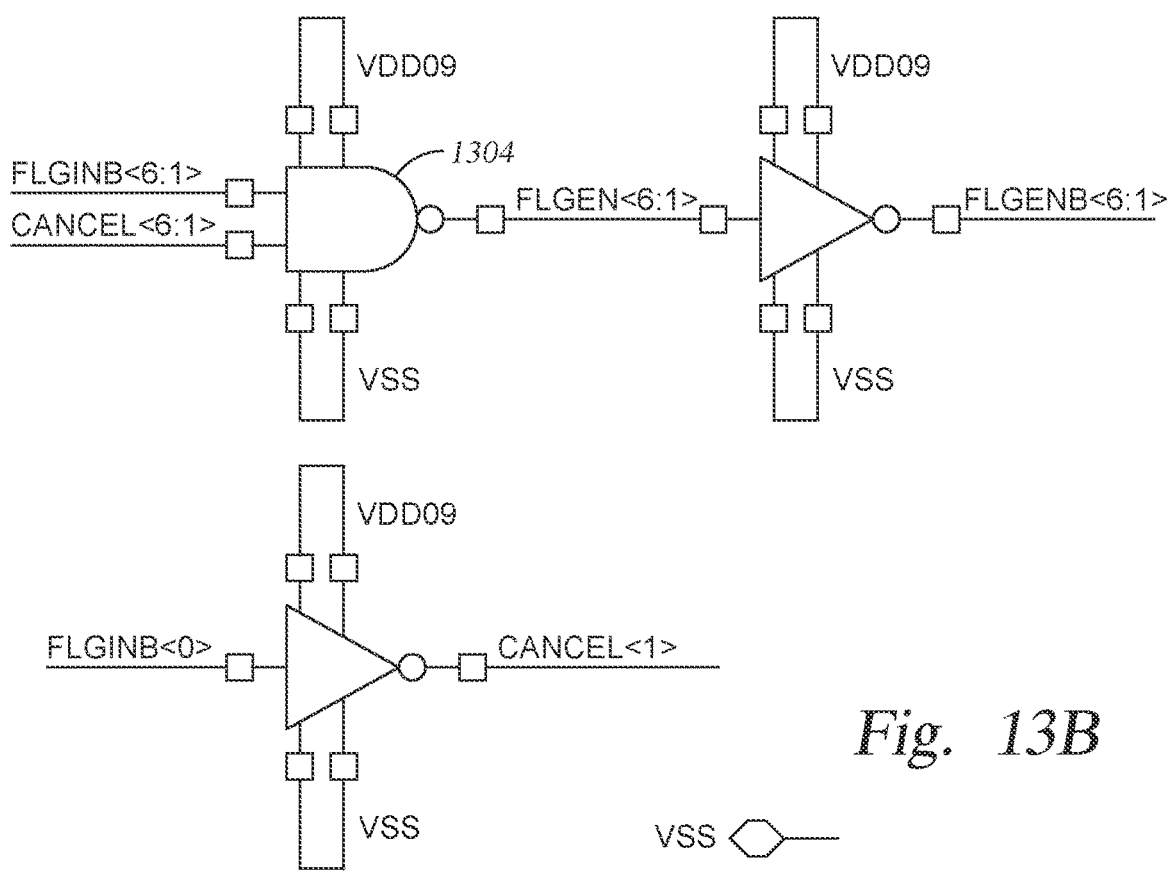
Figure 13C:
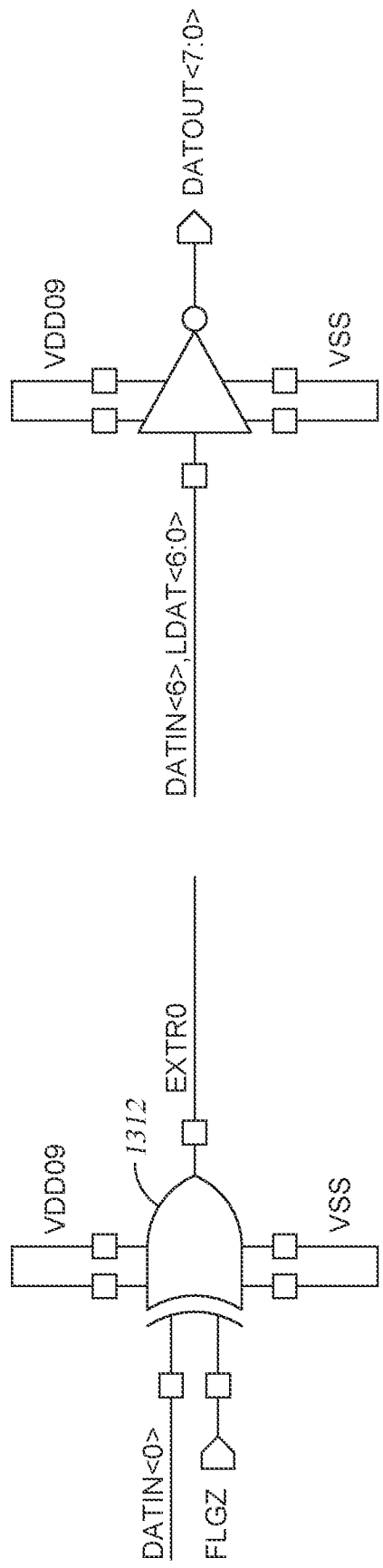
Figure 13D:
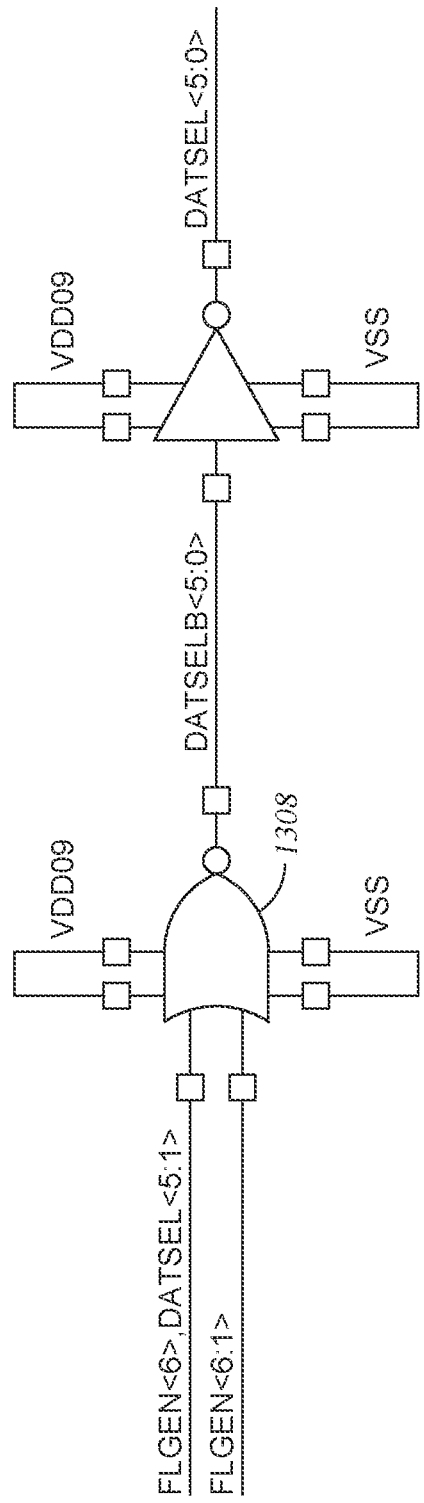
Figure 13E:
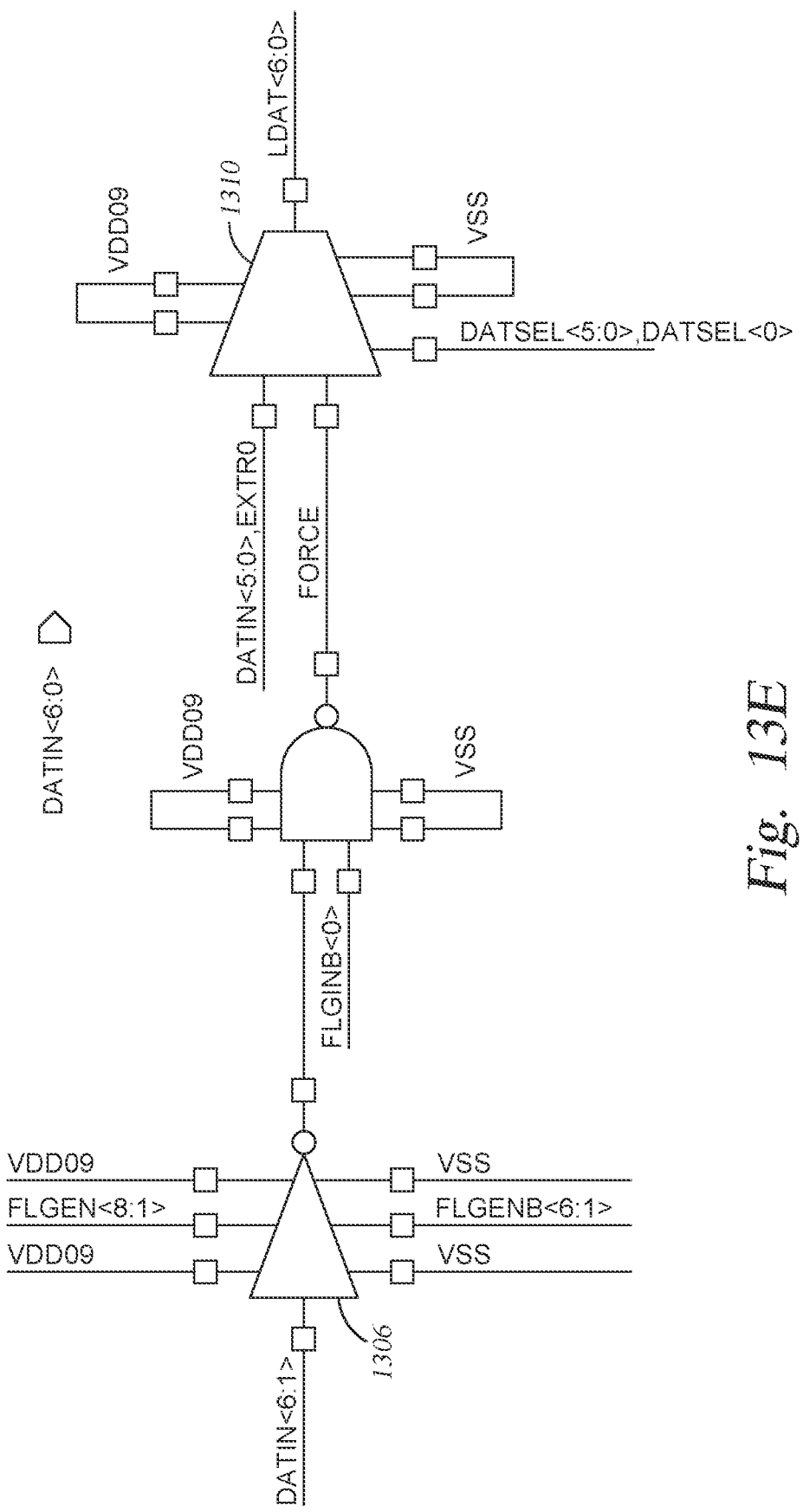

This calibration of the timing interval allows extrapolation of one more bit beyond the LSB during word completion. Specifically, the additional bit may be extrapolated as the exclusive or (XOR) of the LSB value and the metastability flag value. Thus, Extrapolated Bit=LSB⊕Metastability Flag. FIGS. 13A through 13E illustrate an example word completion block, in accordance with an example embodiment of the disclosure. As seen in FIGS. 13A and 13B, NAND gate 1302 along with NOR gate 1304 select the metastability flag with the lowest index. If the LSB is evaluated, all the flags are cancelled. A set of tristate invertors 1306 (shown in FIG. 13E) generates the complementary value of the bit marked with the metastability flag. A set of NOR gates 1308 (shown in FIG. 13D) marks all the bits with index lower than the bit with metastability. If there is no valid metastability flag, no bit is marked. A set of multiplexers 1310 (shown in FIG. 13E) chooses either the evaluated bit value, if there is no valid flag with the index above, or enforces the complementary value of the bit with metastability flag to all the bits below, if the flag is validated by gates 1302 and 1304. XOR gate 1312 (shown in FIG. 13C) extrapolates the additional bit.

Figure 14:
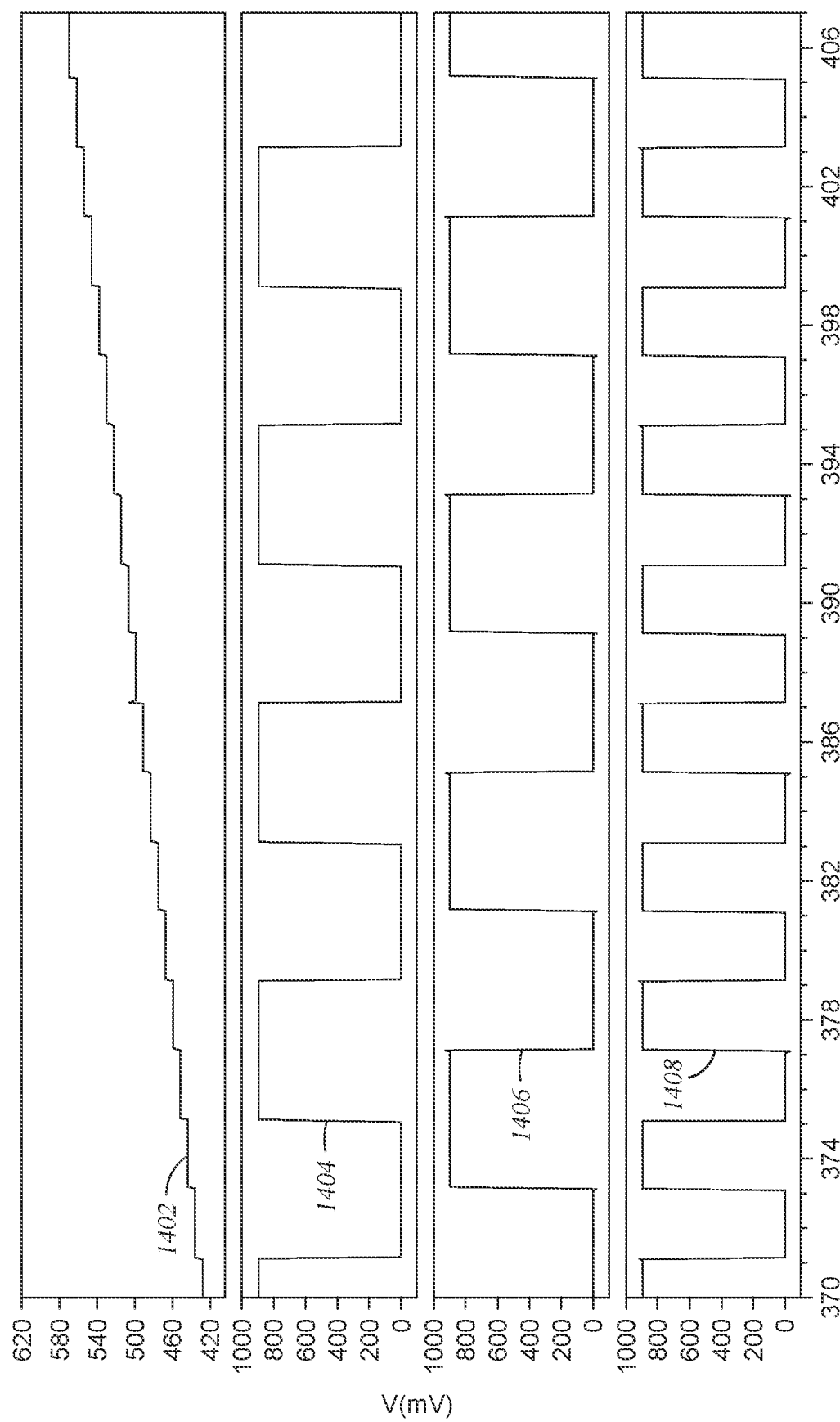
FIG. 14 illustrates an example bit extrapolation, in accordance with an example embodiment of the disclosure.

FIG. 14 illustrates an example bit extrapolation 1400, in accordance with an example embodiment of the disclosure. The simulation is performed on an ADC where the back calibration procedure has already converged. The ADC input signal is a slow ramp (not shown). The top row 1402 of the plot is the ADC digital output converted back to analog signal for the purpose of visualization. The second row 1404 contains the plot of the LSB evaluated by the ADC. The third row 1406 shows the metastability flags generated during the evaluation of the LSB. The fourth row 1408 contains the plot of the extrapolated additional bit. The metastability flag signal has a 50% duty cycle, the additional bit is extrapolated correctly, and the ramp ADC output signal demonstrates a desired differential nonlinearity. Additionally, the additional bit is the exclusive or of the LSB value and the metastability flag value.

The proposed background calibration of the timing interval effectively compensates for the process and temperature induced comparator and timer parameter variation, in some embodiments. However, the power supply variation may be too fast for the calibration algorithm to react. Single ended topology of the timer and differential topology of the comparator may lead to different effect of the power supply variation on the timing parameters of these blocks. This mismatch may cause an excessive error in the additional bit extrapolation. To improve the comparator and timer matching, the current source 603 of FIG. 6 could be formed using two components. The first component may have a strong dependency of the power supply voltage like a resistor, while the second component may have a minimal dependency on the power supply value. By choosing a proper ratio of these two components a better matching of the timer and comparator timing parameters may be achieved.

As utilized herein the terms "circuits" and "circuitry" refer to physical electronic components (i.e. hardware) and any software and/or firmware ("code") which may configure the hardware, be executed by the hardware, and or otherwise be associated with the hardware. As used herein, for example, a particular processor and memory may comprise a first "circuit" when executing a first one or more lines of code and may comprise a second "circuit" when executing a second one or more lines of code. As utilized herein, "and/or" means any one or more of the items in the list joined by "and/or". As an example, "x and/or y" means any element of the three-element set {(x), (y), (x, y)}. In other words, "x and/or y" means "one or both of x and y". As another example, "x, y, and/or z" means any element of the seven-element set {(x), (y), (z), (x, y), (x, z), (y, z), (x, y, z)}. In other words, "x, y and/or z" means "one or more of x, y and z". As utilized herein, the term "exemplary" means serving as a non-limiting example, instance, or illustration. As utilized herein, the terms "e.g.," and "for example" set off lists of one or more non-limiting examples, instances, or illustrations. As utilized herein, circuitry or a device is "operable" to perform a function whenever the circuitry or device comprises the necessary hardware and code (if any is necessary) to perform the function, regardless of whether performance of the function is disabled or not enabled (e.g., by a user-configurable setting, factory trim, etc.).

While the present invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiment disclosed, but that the present invention will include all embodiments falling within the scope of the appended claims.

What is claimed is:

1. A method of operating a successive approximation register (SAR) analog-to-digital converter (ADC), the method comprising:
comparing output signals of a plurality of switched capacitors;
determining, based on a value of a tunable time interval, whether to set a metastability flag for a first bit to be evaluated; and
updating the value of the tunable time interval based on whether the metastability flag was set.

2. The method of claim 1, further comprising increasing an accumulator value in response to determining that the metastability flag was not set, wherein updating the value of the tunable time interval comprises increasing the value of the tunable time interval in response to determining that the accumulator value reaches an overflow limit.

3. The method of claim 2, further comprising setting the accumulator value to half of the overflow limit in response to determining that the accumulator value reaches an overflow limit.

4. The method of claim 1, further comprising decreasing an accumulator value in response to determining that the metastability flag was set, wherein updating the value of the tunable time interval comprises decreasing the value of the tunable time interval in response to determining that the accumulator value reaches zero.

5. The method of claim 4, further comprising setting the accumulator value to half of an overflow limit in response to determining that the accumulator value reaches zero.

6. The method of claim 1, further comprising using the metastability flag for word completion.

7. The method of claim 6, wherein using the metastability flag for word completion comprises extrapolating a second bit based on the first bit and the metastability flag.

8. The method of claim 7, wherein the first bit is a least significant bit of a plurality of bits and the second bit follows the first bit.

9. The method of claim 7, wherein the second bit is an exclusive or of the first bit and the metastability flag.

10. The method of claim 1, wherein the metastability flag is stored in a metastability flag register of the SAR ADC, and wherein the value of the tunable time interval is stored in a time interval tune register of the SAR ADC.

11. A SAR ADC comprising:
a plurality of switched capacitors configured to sample input signals;
a comparator configured to compare output signals from the plurality of switched capacitors; and
a metastability detector configured to:
determine, based on a value of a tunable time interval, whether to set a metastability flag for a first bit to be evaluated; and
update the value of the tunable time interval based on whether the metastability flag was set.

12. The SAR ADC of claim 11, wherein the metastability detector is further configured to increase an accumulator value in response to determining that the metastability flag was not set, wherein updating the value of the tunable time interval comprises increasing the value of the tunable time interval in response to determining that the accumulator value reaches an overflow limit.

13. The SAR ADC of claim 12, wherein the metastability detector is further configured to set the accumulator value to half of the overflow limit in response to determining that the accumulator value reaches an overflow limit.

14. The SAR ADC of claim 11, wherein the metastability detector is further configured to decrease an accumulator value in response to determining that the metastability flag was set, wherein updating the value of the tunable time interval comprises decreasing the value of the tunable time interval in response to determining that the accumulator value reaches zero.

15. The SAR ADC of claim 14, wherein the metastability detector is further configured to set the accumulator value to half of an overflow limit in response to determining that the accumulator value reaches zero.

16. The SAR ADC of claim 11, wherein the metastability detector is further configured to use the metastability flag for word completion.

17. The SAR ADC of claim 16, wherein using the metastability flag for word completion comprises extrapolating a second bit based on the first bit and the metastability flag.

18. The SAR ADC of claim 17, wherein the first bit is a least significant bit of a plurality of bits and the second bit follows the first bit.

19. The SAR ADC of claim 17, wherein the second bit is an exclusive or of the first bit and the metastability flag.

20. A SAR ADC comprising:
a comparator configured to compare output signals from a plurality of switched capacitors; and
a metastability detector configured to:
determine, based on a value of a tunable time interval, whether to set a metastability flag for a least significant bit of a plurality of bits;
update the value of the tunable time interval based on whether the metastability flag for the least significant bit was set; and
extrapolating an additional bit as an exclusive or of the least significant bit and the metastability flag of the least significant bit.

* * * * *

UNITED STATES PATENT AND TRADEMARK OFFICE
CERTIFICATE OF CORRECTION

PATENT NO. : 11,811,419 B2
APPLICATION NO. : 17/652213
DATED : November 7, 2023
INVENTOR(S) : Oleksiy Zabroda et al.

Page 1 of 1

It is certified that error appears in the above-identified patent and that said Letters Patent is hereby corrected as shown below:

In the Specification

In Column 5, Line 12, delete "$2'(2*B(i)-1)$" and insert -- $2^i(2*B(i)-1)$ --.

In Column 11, Line 65, delete "12" and insert -- 120 --.

In Column 14, Line 19, delete "$T(0.5\ \Delta V(LSB))$," and insert -- $\approx T(0.5\ \Delta V(LSB))$, --.

Signed and Sealed this
Twenty-third Day of July, 2024

Katherine Kelly Vidal
*Director of the United States Patent and Trademark Office*